(12) United States Patent
Zhou et al.

(10) Patent No.: US 8,778,716 B2
(45) Date of Patent: Jul. 15, 2014

(54) INTEGRATED CIRCUITS BASED ON ALIGNED NANOTUBES

(71) Applicant: University of Southern California, Los Angeles, CA (US)

(72) Inventors: Chongwu Zhou, San Marino, CA (US); Koungmin Ryu, Los Angeles, CA (US); Alexander Badmaev, Hillsboro, OR (US); Chuan Wang, Albany, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 13/740,955

(22) Filed: Jan. 14, 2013

(65) Prior Publication Data

US 2013/0134394 A1    May 30, 2013

Related U.S. Application Data

(63) Continuation of application No. 12/625,543, filed on Nov. 24, 2009, now Pat. No. 8,354,291.

(60) Provisional application No. 61/117,390, filed on Nov. 24, 2008.

(51) Int. Cl.
*H01L 21/02* (2006.01)

(52) U.S. Cl.
USPC ........ 438/57; 438/59; 438/478; 257/E21.411; 257/E29.268; 257/E31.011; 257/E45.002

(58) Field of Classification Search
USPC .............. 438/57–62, 478; 257/E21.009, 411, 257/29.268, 31.001, 45.002; 977/742, 842, 977/843
See application file for complete search history.

(56) References Cited

U.S. PATENT DOCUMENTS

| | | | |
|---|---|---|---|
| 6,333,016 B1 | 12/2001 | Resasco et al. |
| 6,361,861 B2 | 3/2002 | Gao et al. |
| 6,440,761 B1 | 8/2002 | Choi |
| 6,646,598 B1 | 11/2003 | Timothy et al. |
| 6,756,026 B2 | 6/2004 | Colbert et al. |
| 6,882,051 B2 | 4/2005 | Majumdar et al. |
| 7,160,532 B2 | 1/2007 | Liu et al. |
| 7,288,321 B2 | 10/2007 | Liu et al. |
| 7,338,554 B2 | 3/2008 | Delaunay et al. |
| 7,394,118 B2 | 7/2008 | Zhou |

(Continued)

FOREIGN PATENT DOCUMENTS

WO    WO2011137404 A2    11/2011
WO    WO2012135380 A2    10/2012

OTHER PUBLICATIONS

Arnold et al., "Enrichment of Single-Walled Carbon Nanotubes by Diameter in Density Gradients," *Nano Lett.* 5(4):713-718, 6 pages, Mar. 2005.

(Continued)

*Primary Examiner* — Michael Lebentritt
(74) *Attorney, Agent, or Firm* — Fish & Richardson P.C.

(57) ABSTRACT

Techniques, apparatus and systems are described for wafer-scale processing of aligned nanotube devices and integrated circuits. In one aspect, a method can include growing aligned nanotubes on at least one of a wafer-scale quartz substrate or a wafer-scale sapphire substrate. The method can include transferring the grown aligned nanotubes onto a target substrate. Also, the method can include fabricating at least one device based on the transferred nanotubes.

22 Claims, 35 Drawing Sheets

(56) References Cited

U.S. PATENT DOCUMENTS

| | | | |
|---|---|---|---|
| 7,419,651 B2 | 9/2008 | Smalley et al. | |
| 7,438,844 B2 | 10/2008 | Huang et al. | |
| 7,511,206 B2 | 3/2009 | Hiraoka et al. | |
| 7,576,971 B2 | 8/2009 | Lipka et al. | |
| 7,662,652 B2 | 2/2010 | Zhou | |
| 7,687,876 B2 | 3/2010 | Kabir | |
| 7,834,530 B2 | 11/2010 | Manohara et al. | |
| 7,858,454 B2 | 12/2010 | Kalburge | |
| 8,063,451 B2 | 11/2011 | Zhang | |
| 8,066,842 B2 | 11/2011 | Farmer et al. | |
| 8,187,746 B2 | 5/2012 | Chen et al. | |
| 8,324,087 B2 | 12/2012 | Zhou et al. | |
| 8,354,291 B2 * | 1/2013 | Zhou et al. | 438/57 |
| 2002/0130311 A1 | 9/2002 | Lieber et al. | |
| 2003/0107065 A1 | 6/2003 | Taniguchi et al. | |
| 2004/0018371 A1 | 1/2004 | Mao | |
| 2004/0036128 A1 | 2/2004 | Zhang | |
| 2004/0043219 A1 | 3/2004 | Ito et al. | |
| 2004/0240156 A1 | 12/2004 | Norton et al. | |
| 2005/0189883 A1 | 9/2005 | Suh et al. | |
| 2006/0113510 A1 | 6/2006 | Luo et al. | |
| 2007/0281409 A1 | 12/2007 | Zhang | |
| 2008/0008844 A1 | 1/2008 | Bettge et al. | |
| 2008/0158778 A1 | 7/2008 | Lipka et al. | |
| 2008/0173864 A1 | 7/2008 | Fujita | |
| 2008/0182369 A1 | 7/2008 | Jeong et al. | |
| 2008/0247118 A1 | 10/2008 | Long et al. | |
| 2008/0261342 A1 | 10/2008 | Zhou | |
| 2008/0292840 A1 | 11/2008 | Majumdar et al. | |
| 2009/0045061 A1 | 2/2009 | Farrow et al. | |
| 2009/0061315 A1 | 3/2009 | Nakano et al. | |
| 2009/0085063 A1 | 4/2009 | Makiyama et al. | |
| 2009/0101962 A1 | 4/2009 | Hong | |
| 2009/0146208 A1 | 6/2009 | Ban | |
| 2009/0166686 A1 | 7/2009 | Hunt | |
| 2009/0224230 A1 | 9/2009 | Pesetski | |
| 2009/0278111 A1 | 11/2009 | Pop | |
| 2010/0001255 A1 | 1/2010 | Bao | |
| 2010/0065818 A1 | 3/2010 | Kim et al. | |
| 2010/0127242 A1 | 5/2010 | Zhou et al. | |
| 2010/0133511 A1 | 6/2010 | Zhou et al. | |
| 2011/0073837 A1 | 3/2011 | Zhou et al. | |
| 2011/0101302 A1 | 5/2011 | Zhou et al. | |
| 2011/0229777 A1 | 9/2011 | Mak et al. | |
| 2011/0235240 A1 | 9/2011 | Lu et al. | |
| 2011/0262772 A1 | 10/2011 | Hauge et al. | |
| 2011/0277813 A1 | 11/2011 | Rogers et al. | |
| 2011/0304953 A1 | 12/2011 | Zhou et al. | |
| 2011/0304955 A1 | 12/2011 | Zhou et al. | |
| 2012/0012817 A1 | 1/2012 | Hong | |
| 2012/0138902 A1 | 6/2012 | Hunt | |
| 2012/0248416 A1 | 10/2012 | Zhou et al. | |
| 2012/0261646 A1 | 10/2012 | Zhou et al. | |

OTHER PUBLICATIONS

Arnold et al., "Sorting Carbon Nanotubes by Electronic Structure Using Density Differentiation," *Nat. Nanotechnol.*, 1:60-65, Oct. 2006.

Artukovic et al., "Transparent and Flexible Carbon Nanotube Transistors," 2005, *Nano Lett.* 5(4):757-760, 4 pages.

Avouris et al., "Carbon nanotubes: nanomechanics, manipulation, and electronic devices," 1999, *Applied Surface Science* 141(304):201-209, 9 pages.

Avouris et al., "Carbon-Based Electronics," Oct. 2007, *Nature Nanotechnology*, 2:605-615, 11 pages.

Avouris, P., Graphene: Electronic and Photonic Properties and Devices, *Nano Letters*, 2010, 10:4285-4294.

Bachilo et al., "Narrow (n,m)-Distribution of Single-Walled Carbon Nanotubes Grown Using a Solid Supported Catalyst," 2003, *Journal of the American Chemical Society*, 125(37):11186-11187.

Bae et al., "Roll-to-roll production of 30-inch graphene films for transparent electrodes," *Nature Nanotechnol*, Jun. 2010, 5:574-578.

Bohr, "Nanotechnology Goals and Challenges for Electronic Applications," Mar. 2002, *IEEE Transactions on Nanotechnology*, 1(1):56-62.

Buffa et al., "Side-Wall Functionalization of Single-Walled Carbon Nanotubes with 4-Hydroxymethylaniline Followed by Polymerization of -Caprolactone,"2005, *Macromolecules*, 38, 8258-8263, 6 pages.

Burke, "AC performance of nanoelectronics: towards a ballistic THz nanotube transistor," *Solid-State Electronics*, 48(10-11): 1981-1986, Oct.-Nov. 2004.

Cao et al., "Gate Capacitance Coupling of Singled-Walled Carbon Nanotube Thin Film Transistors," 2007, *Appl. Phys. Lett.*, vol. 90, 023516-1-023516-3, 4 pages.

Cao et al., "Ultrathin Films of Single-Walled Carbon Nanotubes for Electronics and Sensors: A Review of Fundamental and Applied Aspects," *Advanced Materials*, 2009, 21, 29-53, 25 pages.

Chan et al., "Oxidation of Carbon Nanotubes by Singlet O2," Feb. 28, 2003, *Physical Review Letters*, 90(8):86403-1-4 (2003), 4 pages.

Chaste et al., "Single carbon nanotube transistor at GHz frequency," *Nano Lett.*, 8(2):525-528, Jan. 2008.

Chattopadhyay et al., "A Route for Bulk Separation of Semiconducting from Metallic Single-Wall Carbon Nanotubes," 2003, *J. Am. Chem. Soc.*, 125, 3370-3375, 6 pages.

Chen et al., "Flexible and transparent supercapacitor based on In2O3 nanowire/carbon nanotube heterogeneous films," *Applied Physics Letters* 94(4), 043113 http://dx.doi.org/10.1063/1.3069277, 3 pages, Jan. 2009.

Chen et al., "Bulk Separative Enrichment in Metallic or Semiconducting Single-Walled Carbon Nanotubes," 2003, *Nano Letters*, 3(9):1245-1249, 5 pages.

Chen et al., "Chemically Doped Double-Walled Carbon Nanotubes: Cylindrical Molecular Capacitors," Jun. 27, 2003, *Physical Review Letters*, 90(25):257403-1-257403-1, 4 pages.

Chen et al., "Novel Method of Converting Metallic-Type Carbon Nanotubes to Semiconducting-Type Carbon Nanotube Field-Effect Transistors," 2006, *Japanese Journal of Applied Physics* 45(4B):3680-3685, 6 pages.

Chen et al., "Toward the Extraction of Single Species of Single-Walled Carbon Nanotubes Using Fluorene-Based Polymers," 2007, *Nano Letters* 7, 3013, 5 pages.

Dimitrakopoulos et al., "Wafer-scale epitaxial graphene growth on the Si-face of hexagonal SiC (0001) for high frequency transistors," *Journal of Vacuum Science & Technology B*, 28(5):985-992, Sep. 2010.

Dimitrakopoulos et al., "Organic Thin-Film Transistors: A Review of Recent Advances," 2001, *IBM J. Res. Dev.*, 45, 11-27, 17 pages.

Ding et al., "Self-aligned U-gate carbon nanotube field-effect transistor with extremely small parasitic capacitance and drain-induced barrier lowering," *ACS Nano*, 2011, 5:2512-2519.

Engel et al., "Thin Film Nanotube Transistors Based on Self-Assembled, Aligned, Semiconducting Carbon Nanotube Arrays," *ACS Nano*, 2(12):2445-2452, Dec. 2008.

Forrest, S. R., "The Path to Ubiquitous and Low-Cost Organic Electronic Appliances on Plastic," 2004, *Nature*, 428, 911-918, 8 pages.

Geim and Novoselov, "The rise of graphene," *Nature Materials*, 2007, 6:183-191.

Gelinck et al., "Flexible Active-Matrix Displays and Shift Registers Based on Solution-Processed Organic transistors," 2004, *Nat. Mater.*, 3, 106-110, 5 pages.

Gomez et al., "Scalable light-induced metal to semiconductor conversion of carbon nanotubes," *Nano Lett.*, 9(10):3592-3598, Sep. 2009.

Gomez-De Arco et al., "Resonant micro-Raman spectroscopy of aligned single-walled carbon nanotubes on a-plane sapphire," 2008, *Applied Physics Letters* 93:123112.1-3, 3 pages.

Han et al., "High-frequency graphene voltage amplifier, *Nano Lett,*" 2011, 11:3690-3693.

Hu et al., "Percolation in Transparent and Conducting Carbon Nanotube Networks ," 2004, *Nano Lett.*, 4, 2513-2517, 5 pages.

Huang et al., "Preferential Destruction of Metallic Single-Walled Carbon Nanotubes by Laser Irradiation," 2006, *J. Phys. Chem. B*, 110(14):7316-7320, 5 pages.

(56) References Cited

OTHER PUBLICATIONS

Ishikawa et al., "Transparent Electronics Based on Transfer Printed Aligned Carbon Nanotubes on Rigid and Flexible Substrates ," 2008, *ACS Nano*, 3, 73-79, 7 pages.

Javey et al., "Carbon Nanotube Field-Effect Transistors with Integrated Ohmic Contacts and High-K Gate Dielectrics," *Nano Lett.*, 4, 447-450, Feb. 2004.

Javey et al., "Self-Aligned Ballistic Molecular Transistors and Electrically Parallel Nanotube Arrays," *Nano Lett*, 4(7):1319-1322, Jun. 2004.

Joselevich and Lieber, "Vectorial Growth of Metallic and Semiconducting Single-Wall Carbon Nanotubes," 2002, *Nano Letters*, 2(10):1137-1141, 5 pages.

Ju et al., "37.3: High Performance 2.2" QCIF Full Color AMOLED Display based on Electrophosphorescence, *SID Symposium Digest of Technical Papers*, 33(1):1096-1099, May 2002.

Kim et al., "Raman and IR Spectroscopy of Chemically Processed Single-Walled Carbon Nanotubes," 2005, *Journal of the American Chemical Society*, 127, 15437-15445, 9 pages.

Kim et al., "Realization of a high mobility dual-gated graphene field-effect transistor with Al2O3 dielectric," *Appl. Phys. Lett*, 2009, 94, 062107.

Klauk et al., "Flexible Organic Complementary Circuits," 2005, *IEEE Trans. Electron Devices*, 52, 618-622, 5 pages.

Kocabas et al., "Experimental and Theoretical Studies of Transport through Large Scale, Partially Aligned Arrays of Single-Walled Carbon Nanotubes in Thin Film Type Transistors," *Nano Lett.*, 7(5):1195-1202, 2007.

Kocabas et al., "High-Frequency Performance of Submicrometer Transistors That Use Aligned Arrays of Single-Walled Carbon Nanotubes," *Nano Lett.*, 9(5): 1937-1943, Apr. 2009.

Kocabas et al., "Radio Frequency Analog Electronics Based on Carbon Nanotube Transistors," *Proc. Natl. Acad. Sci. U.S.A.*, 105(5): 1405-1409, Feb. 2008.

Krupke et al., "Separation of Metallic from Semiconducting Single-Walled Carbon Nanotubes," *Science* 301(5631):344-347, online Jun. 2003, print Jul. 2003.

LeMieux et al., "Self-Sorted, Aligned Nanotube Networks for Thin-Film Transistors ," Jul. 2008, *Science*, 321,101-104, 5 pages.

Li et al., "Carbon Nanotube Transistor Operation at 2.6 GHz," *Nano Lett.*, 4(4): 753-756, Mar. 2004.

Li et al., "Large-Area Synthesis of High-Quality and Uniform Graphene Films on Copper Foils," *Science*, 2009, 324:1312-1314.

Li et al., "Low operating bias and matched input-output characteristics in graphene logic inverters," *Nano Lett*, 2010, 10:2357-62.

Li et al., "Preferential Growth of Semiconducting Single-Walled Carbon Nanotubes by a Plasma Enhanced CVD Method," 2004, *Nano Letters* 4(2):317-321, 5 pages.

Liao et al., "High-speed graphene transistors with a self-aligned nanowire gate," *Nature*, Sep. 2010, 467:305-308.

Liao et al., "Sub-100 nm channel length graphene transistors," *Nano Lett*, 2010, 10:3952-6.

Lin et al., "100-GHz Transistors from Wafer-Scale Epitaxial Graphene, *Science*," 2010, 327:662.

Lin et al., "Wafer-Scale Graphene Integrated Circuit," *Science*, 2011, 332:1294-1297.

Louarn et al., "Intrinsic current gain cutoff frequency of 30GHz with carbon nanotube transistors," *Appl. Phys. Lett.*, 90(23): 233108-1-233108-3, Jun. 2007.

Mahar et al., "Development of Carbon Nanotube-Based Sensors—A Review," 2007, *IEEE Sensors Journal*, 7(2):266-284, 19 pages.

Meric et al., "Channel length scaling in graphene field-effect transistors studied with pulsed current-voltage measurements," *Nano Lett*, 2011, 11:1093-7.

Meric et al., "Current saturation in zero-bandgap, top-gated graphene field-effect transistors," *Nature Nanotechnol*, 2008, 3:654-9.

Moon et al., "Low-Phase-Noise Graphene FETs in Ambipolar RF Applications," *Electron Device Letters*, IEEE Mar. 2011, 32:270-272.

Moon et al., "Top-Gated Epitaxial Graphene FETs on Si-Face SiC Wafers With a Peak Transconductance of 600 mS/mm," *Electron Device Letters*, IEEE Apr. 2010, 31(4):260-262.

Neto et al., "The electronic properties of graphene," *Reviews of Modern Physics*, 2009, 81:109.

Nish et al., "Highly selective dispersion of single-walled carbon nanotubes using aromatic polymers," 2007, *Nature Nanotechnology* 2:640-646, 7 pages.

Nougaret et al., "80 GHz Field-Effect Transistors Produced Using High Purity Semiconducting Single-Walled Carbon Nanotubes," *Appl. Phys. Lett.*, 94, 243505-1-243505-3, Jun. 2009.

Park et al., "Adsorption of Atomic Hydrogen on Single-Walled Carbon Nanotubes," 2005, *Journal of Physical Chemistry B* 109, 8967-8972, 6 pages.

Park et al., "Generalized Chemical Reactivity of Curved Surfaces: Carbon Nanotubes," 2003, *Nano Letters* 3, 1273, 5 pages.

Pesetski et al., "Carbon Nanotube Field-Effect Transistor Operation at Microwave Frequencies," *Appl. Phys. Lett.* 88: 113103-1-113103-3, Mar. 2006.

Pimparkar et al., "Current-Voltage Characteristics of Long-Channel Nanobundle Thin-Film Transistors: A "Bottom-Up" Perspective ," 2007, *Electron Device Lett.*, 28, 157-160, 4 pages.

Pimparkar et al., "Limits of Performance Gain of Aligned CNT Over Randomized Network: Theoretical Predictions and Experimental Validation ," 2007, *Electron Device Lett.*, 28, 593-595, 3 pages.

Ryu et al, "CMOS-Analogous Wafer-Scale Nanotube-on-Insulator Approach for Submicrometer Devices and Integrated Circuits Using Aligned Nanotubes," *Nano Letters*, 9(1):189-197, online Dec. 2008, print 2009.

Schwierz "Graphene transistors," *Nature Nanotechnology*, Jul. 2010, 5:487-496.

Seo et al., "Chirality- and Diameter-Dependent Reactivity of NO2 on Carbon Nanotube Walls," 2005, *Journal of the American Chemical Society*, 127, 15724-15729, 6 pages.

Sneli et al., "Application of Amorphous Silicon Field Effect Transistors in Addressable Liquid Crystal Display Panels," 1981, *Appl. Phys. Lett.*, 24, 357-362, 6 pages.

Snow et al., "High-Mobility Carbon-Nanotube Thin-Film Transistors on a Polymeric Substrate ," 2005, *Appl. Phys. Lett.*, 86, 033105-1-033105-3, 3 pages.

Snow et al., "Random Networks of Carbon Nanotubes As an Electronic Material ," Mar. 2003, *Appl. Phys. Lett.*, 82, 145-2147, 3 pages.

Tedetti et al., "Hydroxyl radical-induced photochemical formation of dicarboxylic acids from unsaturated fatty acid (oleic acid) in aqueous solution," 2007, *Journal of Photochemistry and Photobiology A*, 188:135-139, 5 pages.

Thostenson et al., "Advances in The Science and Technology of Carbon Nanotubes and Their Composites: A Review," 2001, *Composites Science and Technology* 61:1899-1912, 14 pages.

Uchikoga, S., "Low-Temperature Polycrystalline Silicon Thin-Film Transistor Technologies for System-on-Glass Displays ," 2002, *MRS Bull.*, 27, 881-886, 6 pages.

Vijayaraghavan et al., "Metal-Semiconductor Transition in Single-Walled Carbon Nanotubes Induced by Low-Energy Electron Irradiation," 2005,*Nano Letters* 5(8):1575-1579, 5 pages.

Wang et al., "Analog/RF Performance of Si Nanowire MOSFETs and the Impact of Process Variation," *IEEE Trans. Electron Devices*, 54(6): 1288-1294, Jun. 2007.

Wang et al., "Device study, chemical doping, and logic circuits based on transferred aligned single-walled carbon nanotubes," *Appl. Phys. Lett.*, 93:033101-1-033101-3, Jul. 2008.

Wang et al., "Macroelectronic integrated circuits using high-performance separated carbon nanotube thin-film transistors," *ACS Nano.*, 4(12):7123-7132, Nov. 2010 online, Dec. 2010 print.

Wang et al., "Radio frequency and linearity performance of transistors using high-purity semiconducting carbon nanotubes," *ACS Nano.*, 5(5):4169-4176, Apr. 2011 online, May 2011 print.

Wang et al., "Wafer-Scale fabrication of separated carbon nanotube thin-film transistors for display applications," *Nano Lett.*, 9(12):4285-4291, Nov. 2009 online.

Wang et al., "A high-performance top-gate graphene field-effect transistor based frequency doubler," *Appl. Phys. Lett*, 2010, 96:173104.

(56) References Cited

OTHER PUBLICATIONS

Wang et al., "BN/Graphene/BN Transistors for RF Applications," *Electron Device Letters*, IEEE 2009, 30:547-549.

Wang et al., "Electronically Selective Chemical Functionalization of Carbon Nanotubes: Correlation between Raman Spectral and Electrical Responses," 2005, *Journal of the American Chemical Society* 127(32):11460-11468, 9 pages.

Wang et al., "Graphene-Based Ambipolar RF Mixers," *IEEE Electron Device Letters*, Sep. 2010, 31(9):906-908

Wu et al., "Transparent, Conductive Carbon Nanotube Films," *Science*, 305(5688): 1273-1276, Aug. 2004.

Wu et al., "High-frequency, scaled graphene transistors on diamond-like carbon," *Nature*, Apr. 2011, 472:74-8.

Xu et al., "Quantum Capactiance Limited Vertical Scaling of Graphene Field-Effect Transistor," *ACS Nano*, 2011, 5:2340-2347.

Yang et al., "Triple-mode single-transistor graphene amplifier and its applications," *ACS Nano*, 2010, 4:5532-5538.

Zellner, "Global Aspects of Atmospheric Chemistry," H. Baumgartel, W. Grunbein, F. Hensel, Eds., *Topics in Physical Chemistry* (Springer, New York, 1999), pp. 10-14, 12 pages.

Zhang et al., "Comparison of Graphene Growth on Single-Crystalline and Polycrystalline Ni by Chemical Vapor Deposition," *J. Phys. Chem. Lett.*, 1(20): 3101-3107, Oct. 2010.

Zhang et al., "Hydrogenation and Hydrocarbonation and Etching of Single-Walled Carbon Nanotubes," 2006, *Journal of the American Chemical Society* 128, 6026-6027, 2 pages.

Zhang et al., "Photoisomerization of a Fullerene Dimer," Feb. 2008, *Journal of Physical Chemistry C*, 112, 2802-2804, 3 pages.

Zhang et al., "Selective Etching of Metallic Carbon Nanotubes by Gas-Phase Reaction," Nov. 2006, *Science*, 314: 974-977, 5 pages.

Zhang et al., "Self-Aligned Ballistic n-Type Single-Walled Carbon Nanotube Field-Effect Transistors with Adjustable Threshold Voltage," *Nano Lett*, 2008, 8:3696-3701.

Zhang et al., "Transparent, Conductive, and Flexible Carbon Nanotube Films and Their Application in Organic Light-Emitting Diodes ," 2006, *Nano Lett.*, 6, 1880-1886, 7 pages.

Zheng et al., "Transition of Single-Walled Carbon Nanotubes from Metallic to Semiconducting in Field-Effect Transistors by Hydrogen Plasma Treatment," 2007, *Nano Letters*, 7(6):1622-1625, 4 pages.

Zhou et al., "Band Structure, Phonon Scattering, and the Performance Limit of Single-Walled Carbon Nanotube Transistors," *Phys. Rev. Lett.*, 95, 146805-1-146805-3, Sep. 2005.

Zhou et al., "Structural Characterization and Diameter-Dependent Oxidative Stability of Single Wall Carbon Nanotubes Synthesized by the Catalytic Decomposition of CO," Dec. 14, 2001, *Chemical Physics Letters*, 350:6-14, 9 pages.

PCT/US2011/034691 International Preliminary Report on Patentability, issued Nov. 6, 2012, 9 pages.

PCT/US2011/034691 International Search Report and Written Opinion, mailed Jan. 11, 2012, 13 pages.

PCT/US2012/031006 International Search Report and Written Opinion, mailed Oct. 29, 2012, 8 pages.

UPSTO Transaction History; Apr. 24, 2013; U.S. Appl. No. 12/625,543; 2 pages.

UPSTO Transaction History; Apr. 24, 2013; U.S. Appl. No. 13/447,105; 1 page.

UPSTO Transaction History; Apr. 24, 2013; U.S. Appl. No. 12/728,179; 2 pages.

UPSTO Transaction History; Apr. 24, 2013; U.S. Appl. No. 12/940,674; 1 page.

UPSTO Transaction History; Apr. 24, 2013; U.S. Appl. No. 13/430,457; 1 page.

UPSTO Transaction History; Apr. 24, 2013; U.S. Appl. No. 13/492,547; 1 page.

U.S. Appl. No. 13/492,547, filed Jun. 8, 2012, 48 pages.

Ago et al., "Aligned growth of isolated single-walled carbon nanotubes programmed by atomic arrangement of substrate surface," *Chem. Phys. Lett.*, 408:433-438 (2005).

Bachtold et al., Logic circuits with carbon nanotube transistors, *Science*, 294:1317-1320 (2001).

Cao et al., "Medium-scale carbon nanotube thin-film integrated circuits on flexible plastic substrates," *Nature*, 454:495-500 (2008).

Chen et al., "An integrated logic circuit assembled on a single carbon nanotube," *Science*, 311:1735 (2006).

Collins et al., "Engineering carbon nanotubes and nanotube circuits using electrical breakdown," *Science*, 292:706-709 (2001).

Derycke et al., "Controlling doping and carrier injection in cabon nanotube transistors," *Appl. Phys. Lett.*, 80:2773-2775 (2002).

Derycke et al., "Carbon Nanotube Inter- and Intramolecular Logic Gates," *Nano Lett.*, 1:453-456 (2001).

Dulrkop et al., "Extraordinary Mobility in Semiconducting Carbon Nanotubes," *Nano Lett.*, 4:35-39 (2003).

Han et al., "Template-free directional growth of single-walled carbon nanotubes on a- and r-plane sapphire," *J Am. Chem. Soc.*, 127:5294-5295 (2005).

Heaney et al., "Observations of the alpha-beta phase transition in quartz; a review of imaging and diffraction studies and some new result," *American Mineralogist*, 76:1018-1032 (1991).

Ismach et al., "Atomic-step-templated formation of single wall carbon nanotube patterns," *Angew Chem. Int. Ed.*, 43:6140-6143 (2004).

Javey et al., "Ballistic carbon nanotube field-effect transistors," *Nature*, 424:654-657 (2003).

Javey et al, "Carbon Nanotube Transistor Arrays for Multistage Complementary Logic and Ring Oscillators," *Nano Lett.*, 2:929-932 (2002).

Kang et al., "High-performance electronics using dense, perfectly aligned arrays of single-walled carbon nanotubes," *Nat. Nanotechnol.*, 2:230-236 (2007).

Klinke et al., "Charge transfer induced polarity switching in carbon nanotube transistors," *Nano Lett.*, 5:555-558 (2005).

Kocabas et al., "Guided Growth of Large-Scale, Horizontally Aligned Arrays of Single-Walled Carbon Nanotubes and Their Use in Thin-Film Transistors," *Small*, 1:1110-1116 (2005).

Kong et al., "Alkaline metal-doped n-type semiconducting nanotubes as quantum dots," *Appl. Phys. Lett.*, 77:3977-3979 (2000).

Lin et al., "High-Performance Carbon Nanotube Field-Effect Transistor With Tunable Polarities," *IEEE Transactions on Nanotechnology*, 4:481-489 (2005).

Liu et al., "Novel Nanotube-on-Insulator (NOI) Approach toward Single-Walled Carbon Nanotube Devices," *Nano Lett.*, 6:34-39 (2006).

Liu et al., "Carbon nanotube field-effect inverters," *Appl. Phys. Lett.*, 79:3329-3331 (2001).

Shim et al., "Polymer functionalization for air-stable n-type carbon nanotube field-effect transistors," *J. Am. Chem. Soc.*, 123:11512-11513 (2001).

\* cited by examiner

Etched Nanotube

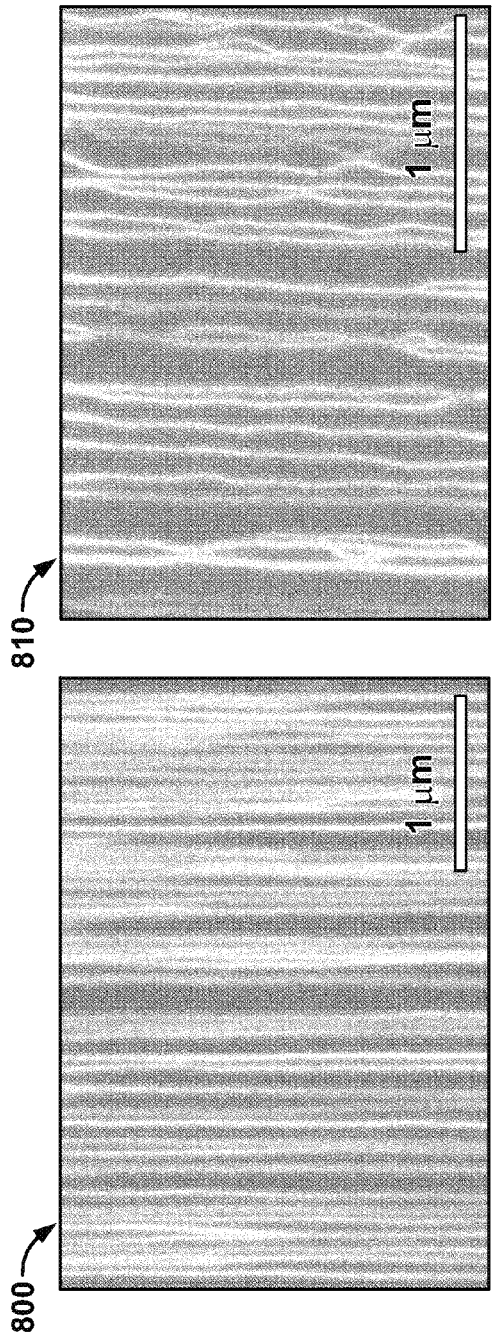
FIG. 8B
FIG. 8A
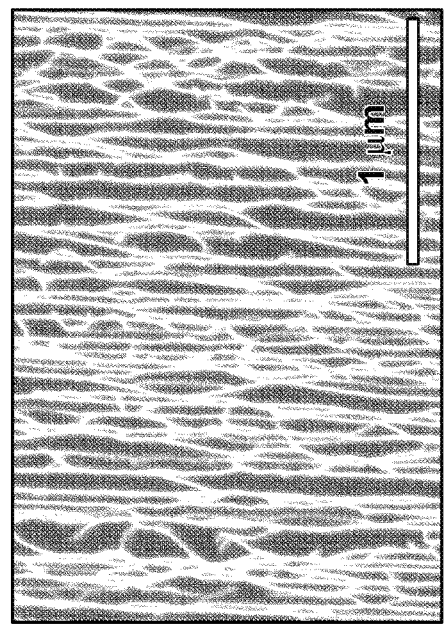
FIG. 8D
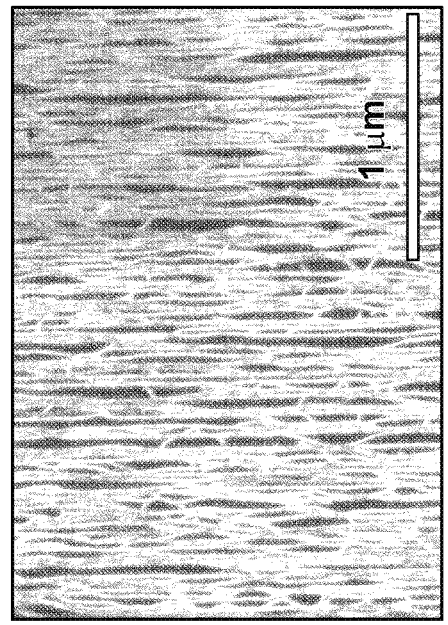
FIG. 8C

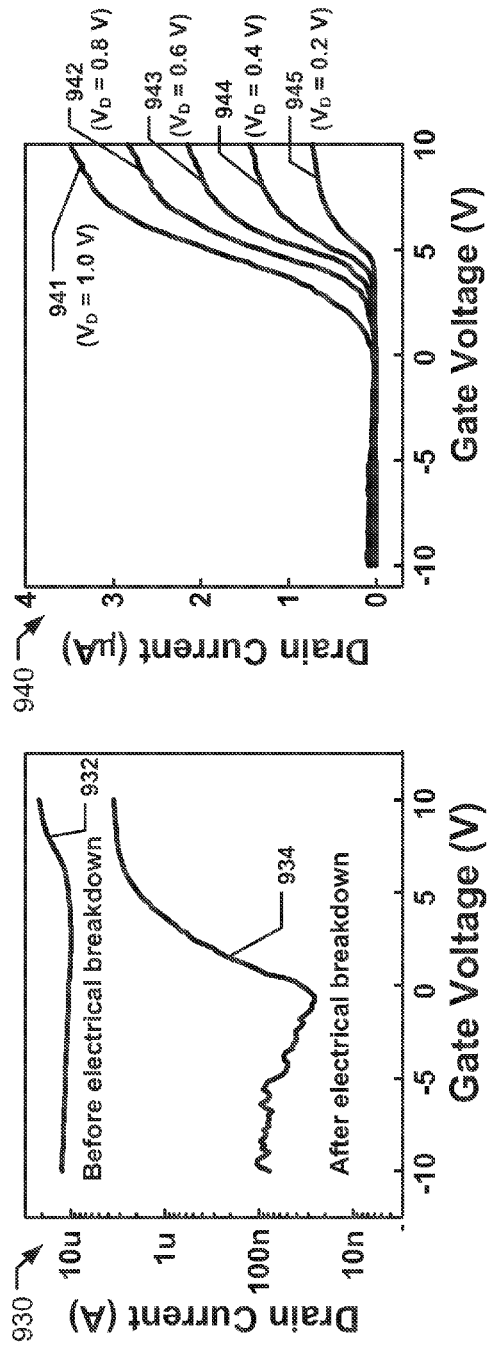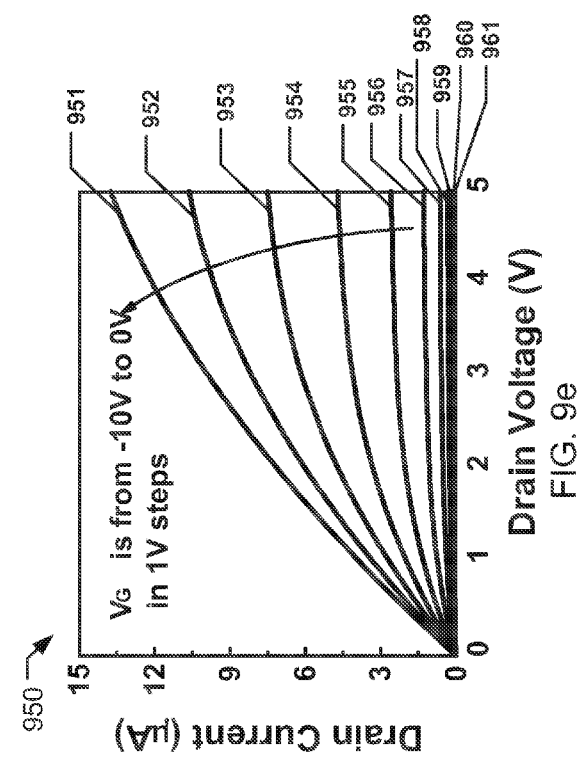

INTEGRATED CIRCUITS BASED ON ALIGNED NANOTUBES

CLAIM OF PRIORITY

This application is a continuation of U.S. patent application Ser. No. 12/625,543, filed on Nov. 24, 2009, now issued U.S. Pat. No. 8,354,291, which claims priority under 35 USC §119(e) to U.S. Patent Application Ser. No. 61/117,390, filed on Nov. 24, 2008, the entire contents of which are hereby incorporated by reference.

FEDERALLY SPONSORED RESEARCH OR DEVELOPMENT

This invention was made with government support under Contract Nos. CCF0702204 and CCF0726815 awarded by National Science Foundation and Contract No. 2003-NT-1107 awarded by Center on Functional Engineered and Nano Architectonics. The government has certain rights in the invention.

BACKGROUND

This application relates to aligned nanotubes.

Single-walled carbon nanotubes (SWNTs) may provide much better performance for electronics than traditional silicon due to their high carrier mobility and current-carrying capacity. Nanotubes can work as ballistic and high mobility transistors, and integrated logic circuits such as inverters and ring-oscillators can be constructed using individual nanotubes.

Randomly grown nanotube networks can be used for flexible devices and circuits. However, the stripe-patterning used to remove heterogeneous percolative transport through metallic nanotube networks cannot be easily scaled to submicron regime, and only PMOS transistors have been demonstrated for the reported circuits.

SUMMARY

This application discloses techniques, apparatus and systems for full wafer-scale processing of massively aligned carbon nanotube arrays for high-performance submicron channel transistors and integrated nanotube circuits.

In one aspect, a method can include growing aligned nanotubes on at least one of a wafer-scale quartz substrate or a wafer-scale sapphire substrate (1210); transferring the grown aligned nanotubes onto a target substrate (1220); and fabricating at least one device based on the transferred nanotubes (1230).

Implementations can optionally include one or more of the following features. The at least one of a wafer-scale quartz substrate or a wafer-scale sapphire substrate can be sized to be at least one of two inches in diameter. Growing the aligned nanotubes on the at least one of a wafer-scale quartz substrate or a wafer-scale sapphire substrate can be carried out with a temperature ramping rate of less than one ° C. per minute but greater than zero ° C. per minute near a quartz phase transition temperature to avoid breakage of quartz wafer.

Transferring the grown aligned nanotubes onto a target substrate can include coating the aligned nanotubes with a film; peeling off the film together with aligned nanotubes using a thermal tape to obtain a composite of the nanotubes and the film; pressing the composite of the nanotubes and the film against the target substrate; removing the thermal tape by heating up the target substrate; and removing the film to leave the nanotubes on the target substrate.

The method can include stacking multiple transfers of nanotubes to increase tube density. Stacking multiple transfers can include stacking multiple composites of the nanotubes and the film on top of each other and over the target substrate. The stacked composites can be etched together to form a network of the aligned nanotubes on the target substrate. The film can include at last one of a metal film or a polymer film. The metal film can include at least one of aluminum or copper. The polymer film can include Poly (methyl methacrylate) (PMMA).

The fabricating can include fabricating submicron back-gated nanotube transistors on the transferred nanotubes with $SiO_2$ as a gate dielectric and Si as a back-gate at a wafer-scale. The fabricating can include fabricating submicron top-gated nanotube transistors on the transferred nanotubes with high-κ $Al_2O_3$ or $HfO_2$ as a gate dielectric and a metal electrode as a top-gate at a wafer-scale. Additionally, stacking multiple transfers of nanotubes can be performed to increase tube density. The fabricating can include fabricating submicron individual back-gated nanotube transistors on the transferred nanotubes with high-κ $Al_2O_3$ or $HfO_2$ as a back-gate dielectric and a metal electrode as an individual back-gate.

The method can include using a defect-tolerant circuit design for a nanotube based integrated circuit, wherein the defect-tolerant circuit design comprises etching away unwanted nanotubes and using same group of nanotubes for the at least one device. The individual back-gated nanotube transistors can facilitate a doping process. The method can include using at least one metal with low work functions as source and drain contacts to align the nanotubes for at least one of n-type nanotube transistors, PN junctions, or CMOS integrated circuits. The at least one metal with low work functions comprises Scandium (Sc), Yttrium (Y), Gadolinium (Gd), Dysprosium (Dy), Ytterbium (Yb), or Terbium (Tb). The fabricating can include fabricating multiple wafer-scale devices comprising at least one of back-gated transistors, top-gated transistors, CMOS inverters, CMOS NOR logic gates, CMOS NAND logic gates, or ring oscillators.

In another aspect, the described techniques can be used to implement a device that includes at least one of the following devices fabricated at a wafer-scale: submicron back-gated nanotube transistors fabricated on aligned nanotubes with SiO2 as a gate dielectric and Si as a back-gate; submicron top-gated nanotube transistors on aligned nanotubes with high-κ $Al_2O_3$ or $HfO_2$ as a gate dielectric and a metal electrode as atop-gate at a wafer-scale; or submicron individual back-gated nanotube transistors on aligned nanotubes with high-κ $Al_2O_3$ or $HfO_2$ as a back-gate dielectric and a metal electrode as an individual back-gate. The apparatus can include at least one of CMOS inverters, CMOS NOR logic gates, CMOS NAND logic gates, or ring oscillators.

In another aspect, the described techniques can be used to implement an apparatus that includes a wafer that includes at least one of the following devices: submicron back-gated nanotube transistors fabricated on aligned nanotubes with SiO2 as a gate dielectric and Si as a back-gate; submicron top-gated nanotube transistors on aligned nanotubes with high-κ $Al_2O_3$ or $HfO_2$ as a gate dielectric and a metal electrode as atop-gate at a wafer-scale; or submicron individual back-gated nanotube transistors on aligned nanotubes with high-κ $Al_2O_3$ or $HfO_2$ as a back-gate dielectric and a metal electrode as an individual back-gate. The wafer can include at least one of CMOS inverters, CMOS NOR logic gates, CMOS NAND logic gates, or ring oscillators.

The techniques, apparatus and systems described herein can provide one or more of the following advantages. For example, truly integrated high-performance nanotube circuits and wafer-scale fabrication can be fabricated. Technical implementations in fabricating the integrated nanotube circuits and wafer-scale fabrication can include wafer-scale synthesis and transfer of aligned nanotubes, and integrated submicron-scale device fabrication and tuning. In addition, the described techniques, apparatus and systems can be used to provide a defect-tolerant circuit design for integrated nanotube circuits. Additionally, the described techniques, apparatus and systems can be used to produce aligned nanotube devices that can that allow for wafer-scale fabrication and integration; enhance transistor performance; and allow for controlled doping to produce truly integrated circuits with p-type and n-type transistors on one chip. These and other aspects and their exemplary implementations are described in detail in the attached drawings, the description and the claims.

BRIEF DESCRIPTION OF THE DRAWINGS

FIGS. 8a, 8b, 8c and 8d show SEM images before a transfer, after 1-time transfer, after 2-time transfer, and after 4-time transfer, respectively.

FIG. 9c shows a transfer ($I_D$-$V_G$) characteristics of a typical n-type nanotube transistor (L=4 μm, and W=8 μm) measured before and after electrical breakdown.

FIG. 9d shows transfer characteristics of an aligned nanotube device after electrical breakdown measured under different drain voltages.

FIG. 9e shows output characteristics ($I_D$-$V_D$) of aligned nanotube devices measured under different gate voltages.

DETAILED DESCRIPTION

Figure 1A:
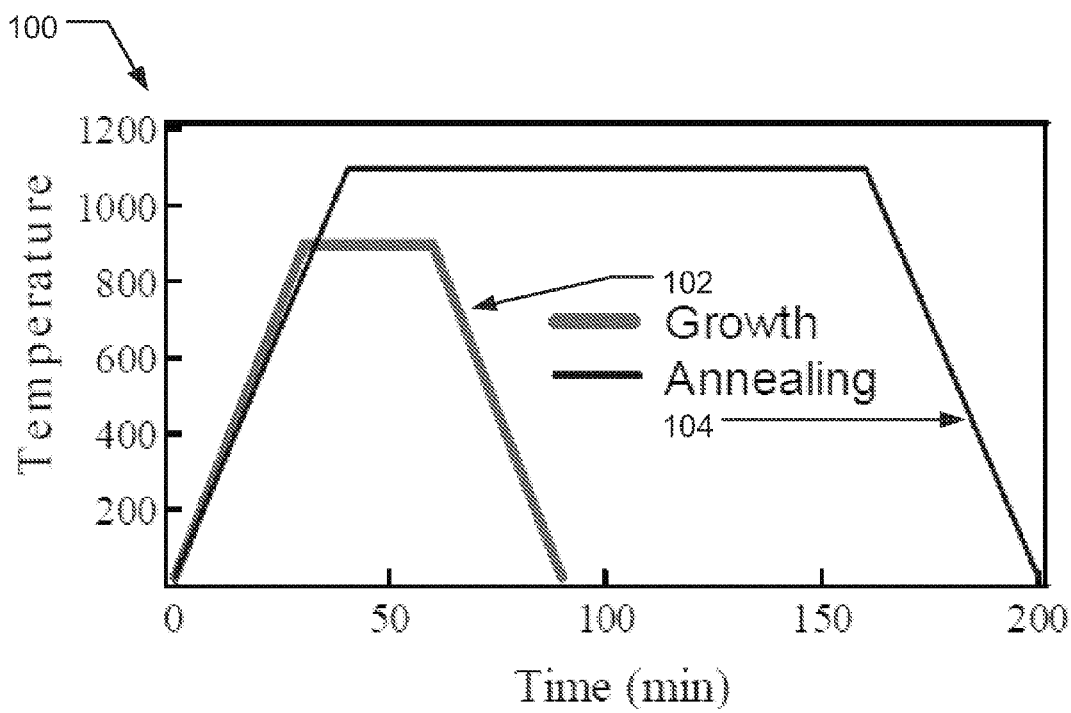
FIG. 1a-i show an example of wafer-scale aligned nanotube synthesis, transfer, and fabrication.

Techniques, systems and apparatus are described for wafer-scale processing of aligned nanotube devices and integrated circuits. The described techniques, apparatus and systems can include wafer-scale synthesis of aligned nanotubes, wafer-scale transfer of nanotubes to silicon wafers, metallic nanotube removal and chemical doping, and defect-tolerant integrated nanotubes circuits. Synthesis of massive aligned nanotubes can be implemented on complete 4 inch quartz and sapphire substrates. The substrates with the massive aligned nanotubes can be transferred to 4 inch Si/SiO$_2$ wafers. Complementary metal-oxide-semiconductor (CMOS) analogous fabrication is performed to yield transistors and circuits with features down to 0.5 μm, with high current density ~20 μA/μm and good on/off ratios. In addition, chemical doping can be used to build a fully integrated complementary inverter with a gain ~5. Further, a defect-tolerant design can be implemented for NAND and NOR gates. This full-wafer approach can be used as a foundation for future integrated nanotube circuits.

Single-walled carbon nanotubes (SWNTs) may provide much better performance for electronics than traditional silicon due to their high carrier mobility and current-carrying capacity. Nanotubes can work as ballistic and high mobility transistors, and integrated logic circuits such as inverters and ring-oscillators can be constructed using individual nanotubes.

Randomly grown nanotube networks can be used for flexible devices and circuits. However, the stripe-patterning used to remove heterogeneous percolative transport through metallic nanotube networks may not be easily scaled to sub-micron regime, and only PMOS transistors were demonstrated for the reported circuits.

Aligned nanotubes can have significant advantages over randomly grown nanotubes in terms of manipulation and integration of nanotubes for device applications. Aligned nanotubes can be grown on sapphire, quartz or similar substrates, for example. Based on massively aligned SWNTs grown on sapphire, a high-yield, registration-free nanotube-on-insulator approach can be used to fabricate nanotube devices in a way analogous to the silicon-on-insulator process. Also, the aligned nanotube devices can be made based on aligned nanotubes on quartz with good uniformity over chip scale and minimized parasitic capacitance.

As described below, full wafer-scale processing of massively aligned carbon nanotube arrays for high-performance submicron channel transistors and integrated nanotube circuits can include growing massive highly aligned nanotubes on quartz and sapphire wafers (e.g., 4 inch in size) using meticulous temperature control and then transferring the aligned nanotubes onto Si/SiO$_2$ wafers using a facile transfer printing method. Wafer-scale device fabrication can be performed on 4 inch Si/SiO$_2$ wafer to yield submicron channel transistors and circuits with high on-current density ~20 μA/μm and good on/off ratios. Additionally, chemical doping methods can be implemented to obtain CMOS inverters with a gain of ~5, for example. A defect-tolerant circuit design for NAND and NOR devices can be implemented to guarantee the correct operation of logic circuit, regardless of the presence of mis-aligned or mis-positioned nanotubes. The wafer-scale nanotube-on-insulator processing using multiple aligned nanotubes as described in this specification can provide significant advantage over conventional processes based on individual nanotubes with respect to current output and device uniformity, and provides a practical and realistic approach for integrated nanotube circuit applications.

Aligned nanotube growth was previously limited to small pieces of quartz or sapphire substrates, as growing nanotubes over complete 4 inch wafers has been very difficult due to the quartz wafer breakage during temperature ramping and the difficulty in uniform growth on complete wafers. The techniques, apparatus and system described in this specification can be used to successfully synthesize aligned SWNTs arrays on 4 inch quartz and sapphire wafers.

Figure 1B:
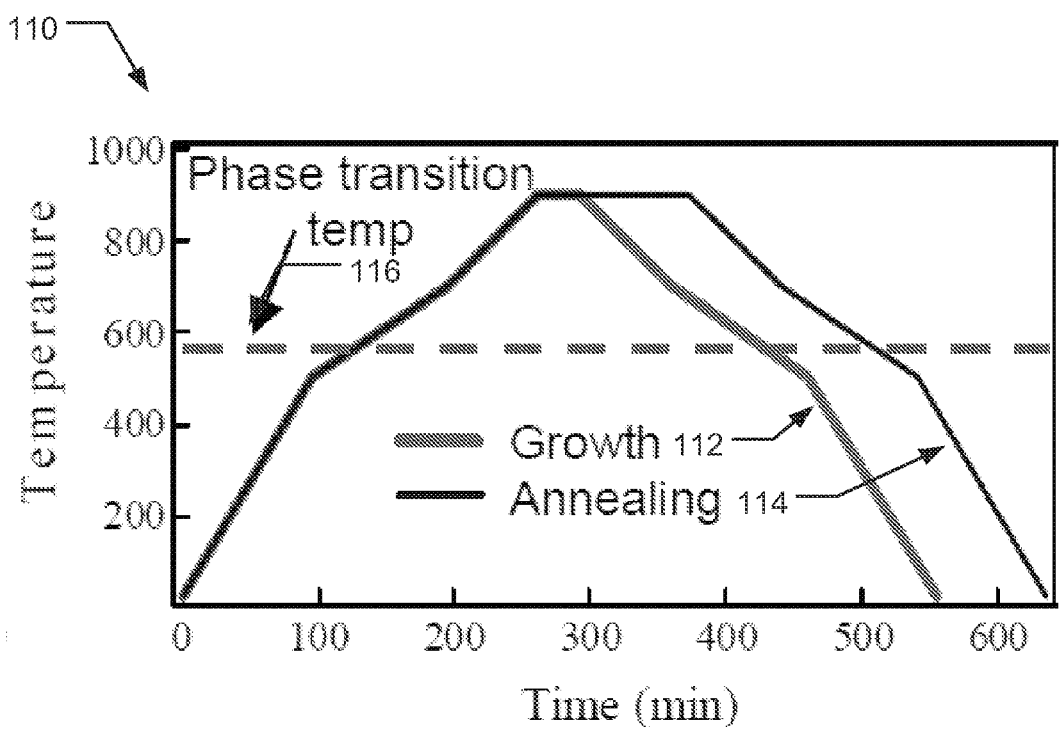

FIGS. 1a-i show an example of a full wafer processing that includes synthesis and transfer printing of aligned nanotubes, and device fabrication. First, both quartz and sapphire wafers are annealed to improve the alignment of nanotubes at 900° C. and 1100° C. for 1.5 hrs in air, respectively. FIG. 1a shows a temperature flow chart 100 for annealing 104 and nanotube growth 102 on a sapphire wafer. FIG. 1b shows a temperature flow chart 110 for annealing 114 and nanotube growth 112 on a quartz wafer. The temperature flow chart 110 shows the phase transition temperature 116 using a dashed line.

The thermally robust a-plane sapphire wafer can be annealed at 1100° C. at high ramping rate (45° C./min) as shown in FIG. 1a, while the 4 inch quartz wafer requires meticulous temperature control (extremely slow ramping rate <1° C./min) to avoid wafer breakage due to the phase transformation of quartz from alpha (α) to beta (β) around 573° C., as shown in FIG. 1b. In addition, the same total gas flow rate can be used for both the ramping up step (3000 sccm Ar and 600 sccm H$_2$) and the growth step (3000 sccm CH$_4$ and 600 sccm H$_2$) to minimize the temperature perturbation. The uniform temperature on entire wafer is needed for the uniform wafer-scale growth of aligned nanotubes on both quartz and sapphire wafers. To obtain uniform temperature, 9 feet-long growth furnace with three-zone temperature controller can be used.

Figure 1C:
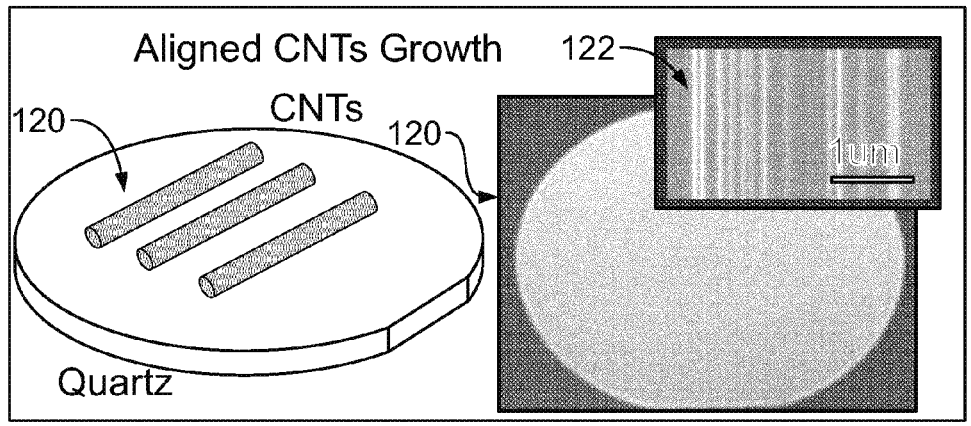
Figure 1D:
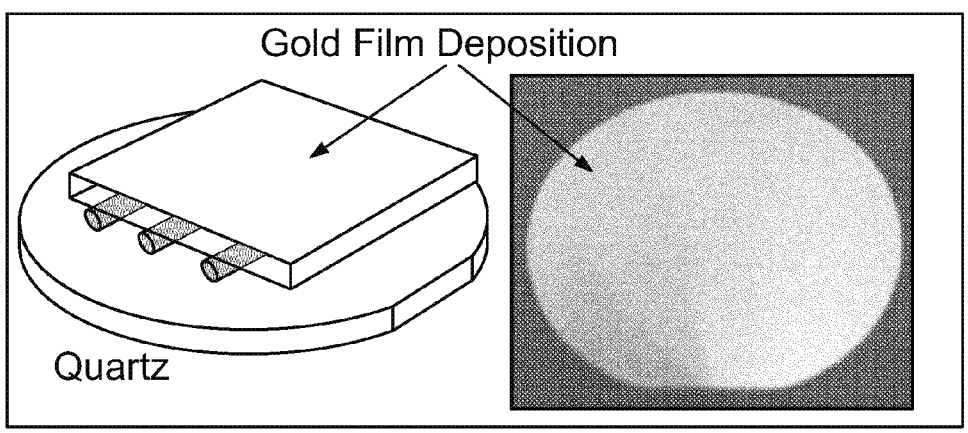
Figure 1E:
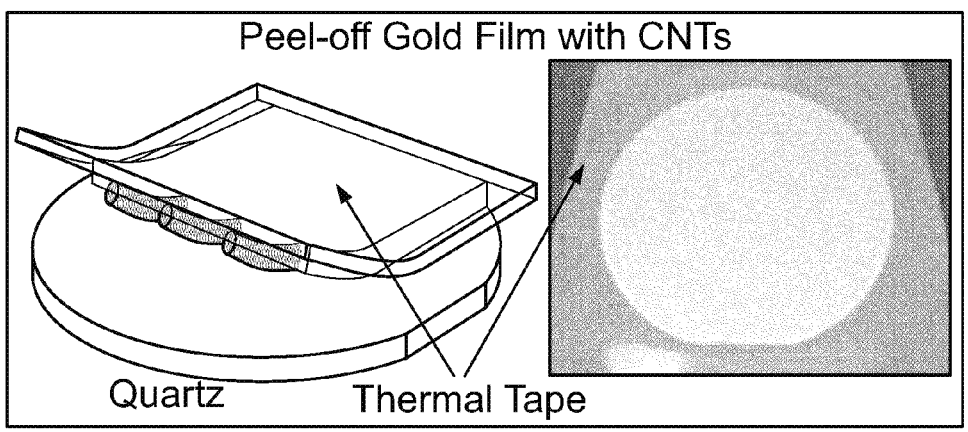
Figure 1F:
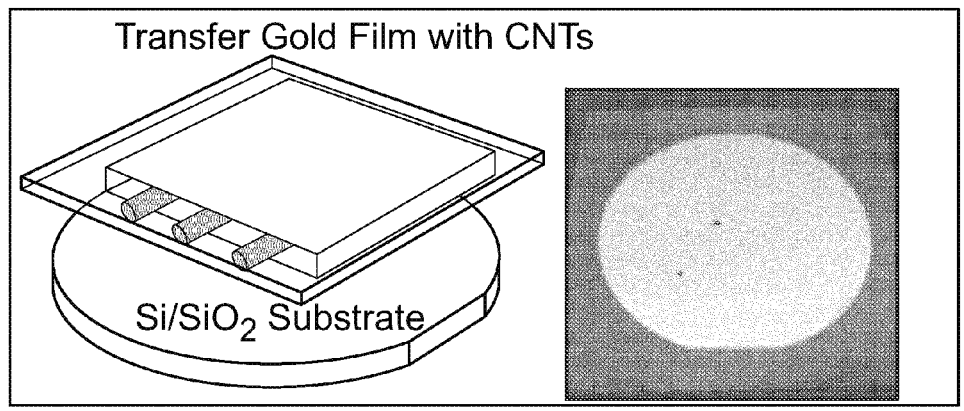
Figure 1G:
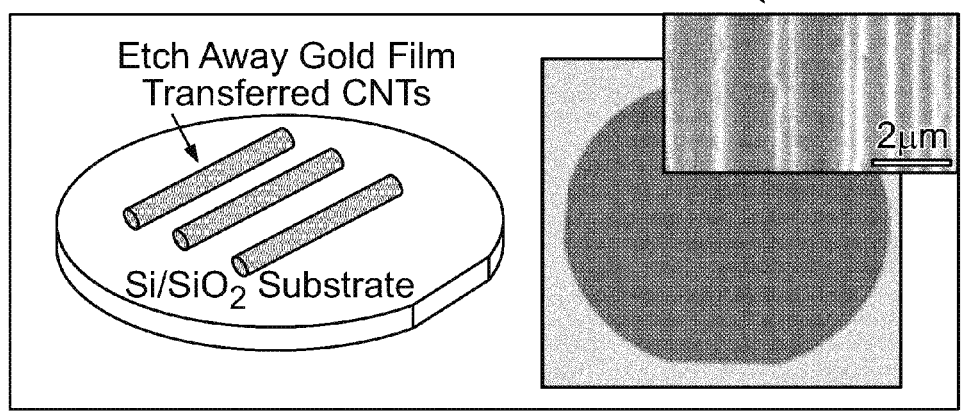

FIG. 1c shows a schematic diagram 120 and a photograph 122 of full wafer synthesis of aligned nanotubes on a 4 inch quartz wafer. The photograph 122 in the inset of FIG. 1c shows an SEM image of aligned nanotubes. After growth, a facile transfer method is used to transfer the aligned nanotubes from 4 inch quartz or sapphire wafers to a target substrate, such as 4 inch Si/SiO$_2$ wafers.

Figure 1H:
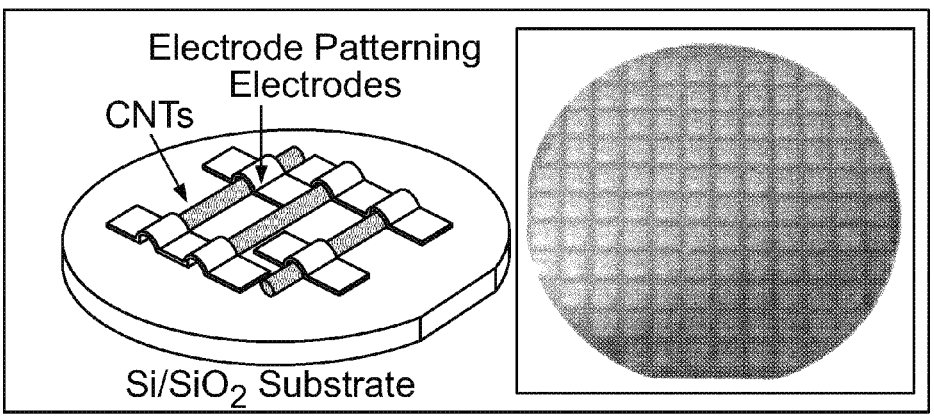

FIG. 1d-h show schematic diagrams and photographs showing the transfer procedure, such as gold film deposition (FIG. 1d, reference no. 130), peeling off the gold film with nanotubes (FIG. 1e, reference no. 140), transfer of the gold film with nanotubes onto a Si/SiO$_2$ substrate (FIG. 1f, reference no. 150), etching away the gold film (FIG. 1g, reference no. 160), and device fabrication on the transferred nanotube arrays (FIG. 1h, reference no. 170). For example, a 100 nm thick gold film can be first deposited onto the aligned SWNTs on the original substrate to ensure conformal contact between nanotubes and the gold film (see FIG. 1d). Other metal films such aluminum or copper film, and polymer films such as Poly(methyl methacrylate) (PMMA) can work equally well for this purpose. To transfer SWNTs onto the targeting substrate, Revalpha thermal tape (from Nitto Denko) is used. Revalph thermal tape has an interesting temperature-dependent adhesive property. For example, the thermal tape is highly adhesive at room temperature, but loses its adhesion at a moderate temperature of 120° C. This thermal tape can be pressed against the original substrate with nanotubes covered by the gold film, and then peeled off together with the gold film and nanotubes (see FIG. 1e). The nanotube/gold film/thermal tape trilayer structure can be pressed against the target substrate, and the tape is then released by simply heating to 120° C. (see FIG. 10. The gold film can be subsequently removed using gold etchant, thus leaving a nice array of massively aligned SWNTs on the target substrate (see FIG. 1g). SEM images of transferred nanotubes on Si substrate with 50 nm thickness of SiO$_2$ are shown in inset 162 of FIG. 1g. The device fabrication based on transferred nanotubes on 4 inch Si/SiO$_2$ wafer (FIG. 1h) can be obtained by standard silicon CMOS technology such as projection photolithography using a stepper with 0.5 μm resolution for submicron device patterning, metal deposition for electrodes, and high k dielectric (HfO$_2$ or Al$_2$O$_3$) deposition for gate dielectric.

Figure 1I:
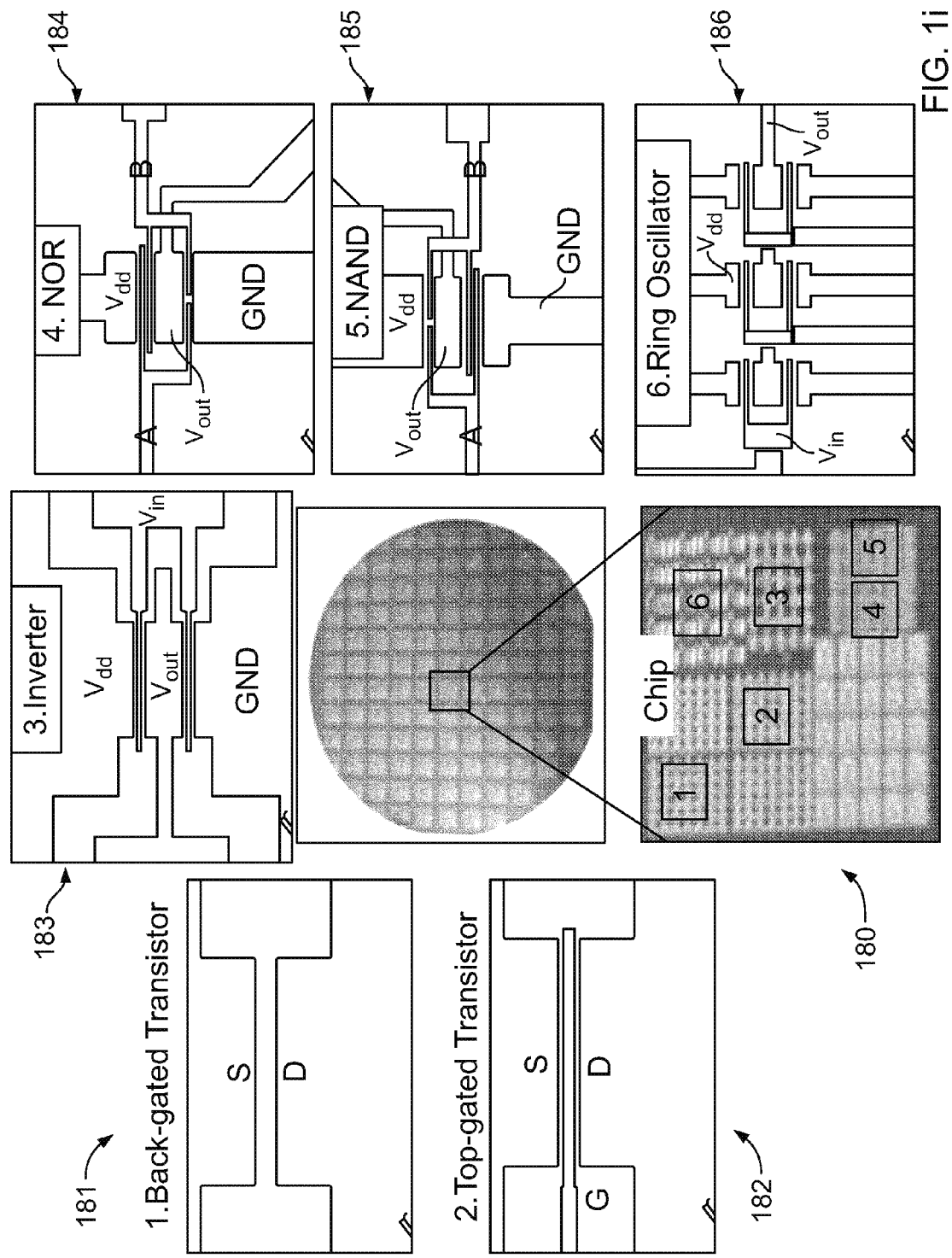

FIG. 1i shows photo images of example nanotube devices and circuits built on a 4 inch Si/SiO2 wafer chip. A typical chip can include at least six different types of devices, including back-gated transistors, top-gated transistors, CMOS inverters, CMOS NOR and NAND logic gates, and ring oscillators. In addition, RF transistors can be characterized.

On the bottom image 180, six areas are labeled using figure reference numbers 1, 2, 3, 4, 5 and 6. Figure reference number 1 represents a back-gated transistor. A corresponding sample image of the back gated transistor is shown in image 181. Figure reference number 2 represents a top-gated transistor. A corresponding sample image of the top-gated transistor is shown in image 182. Figure reference number 3 represents a CMOS inverter. A corresponding sample image of the CMOS inverter is shown in image 183. Figure reference number 4 represents a NOR logic gate. A corresponding sample image of the NOR logic gate is shown in image 184. Figure reference number 5 represents a NAND logic gate. A corresponding sample image of the NAND logic gate is shown in image 185. Figure reference number 6 represents a Ring oscillator. A corresponding sample image of the NOR logic gate is shown in image 186.

Figure 2A:
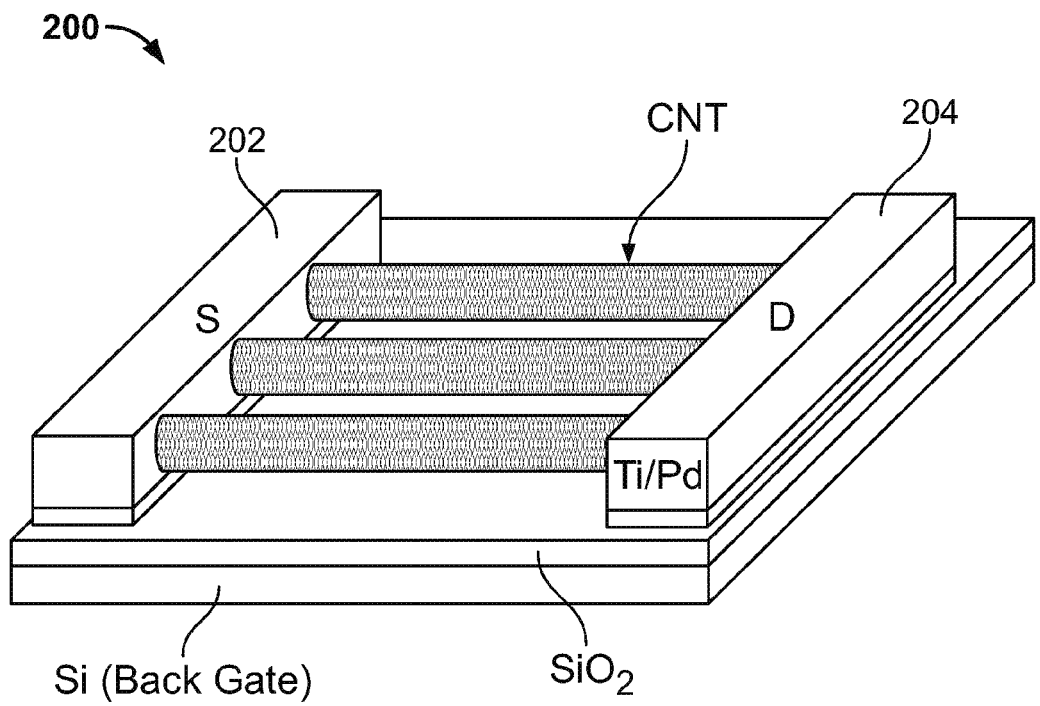
FIG. 2a-h show example characteristics of back-gated transistors down to submicron channel length.
Figure 2B:
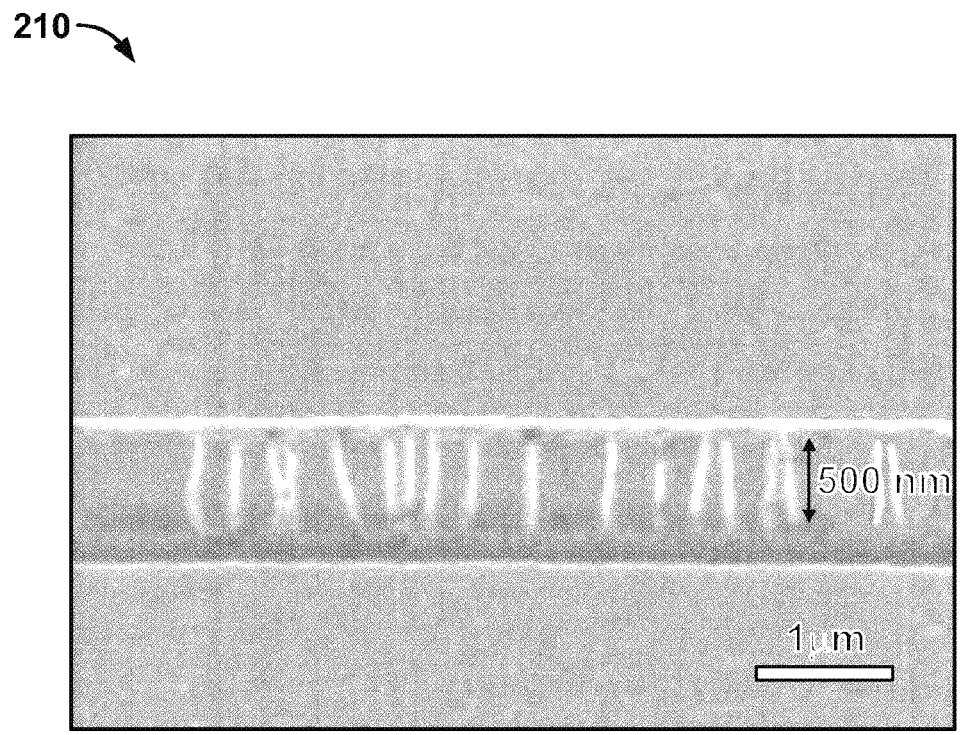

The electrical properties of nanotube transistors can be characterized as basic components for nanotube circuits. Compared with previous devices of micron or tens of micron channel length, the described techniques, apparatus and systems can be used to push the channel length to submicron for the first time. FIGS. 2a-f show a schematic diagram 200, an SEM image 210, and charts 220, 230, 240, 250, 260 and 270 that describe the electrical characteristics of back-gated nanotube devices. Based on the transferred nanotubes on Si with 50 nm SiO$_2$, 5 Å Ti and 70 nm Pd are deposited as Source 202 and Drain 204 electrodes (see FIG. 2a), followed by the removal of nanotubes outside the active channel with O$_2$ plasma. Such devices can be made with channel length (L) of 0.5, 0.75, 1, 2, 5, 10, 20 μm and channel width (W) of 2, 5, 10, 20, 50, and 100 μm, for example. The SEM image 210 in FIG. 2b shows a typical submicron channel device with 2-3 tubes/μm.

Figure 2C:
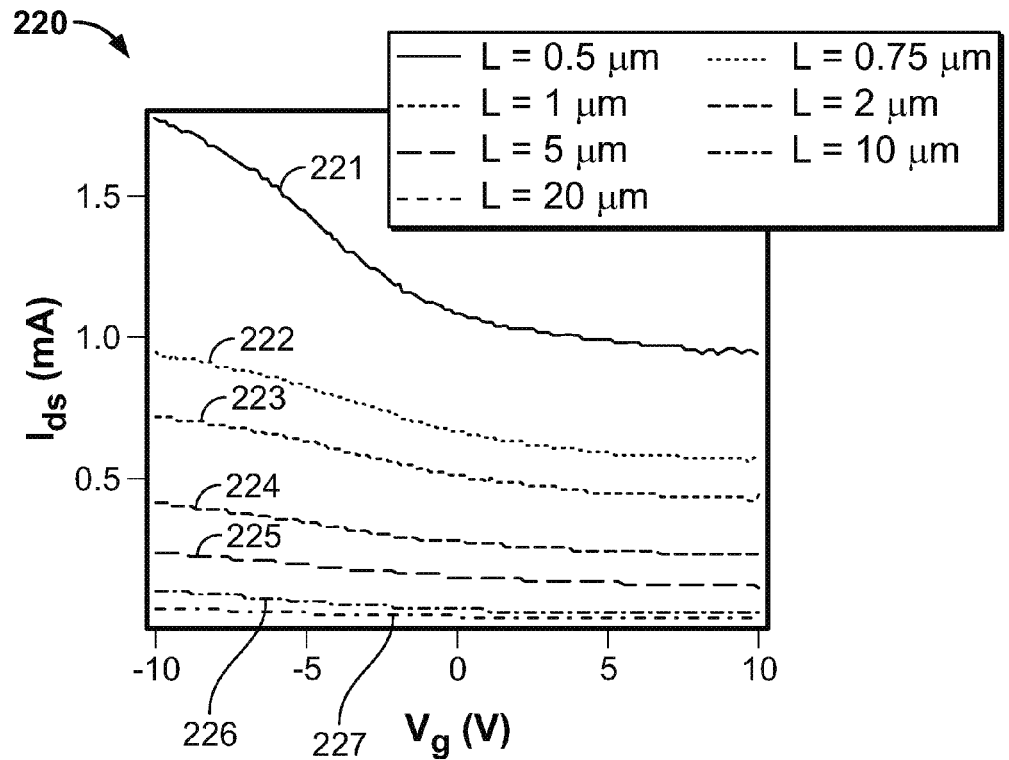

The chart 220 in FIG. 2c exhibits the current-gate voltage ($I_{ds}$-$V_g$) characteristics of the transistors at $V_{ds}$=1 V with W=100 μm and various channel lengths, showing on-currents at $V_g$=−10 V varying from several tens μA to 1.8 mA, reversely proportional to the channel length. The current-gate voltage (Ids-Vg) characteristics of the transistors are shown for channel length (L) of 0.5 μm 221, 0.75 μm 222, 1 μm 223, 2 μm 224, 5 μm 225, 10 μm 226 and 20 μm 227. Additionally, the normalized on and off-current densities ($I_{ds}$/W) can be deduced from the same devices in FIG. 2c.

Figure 2D:
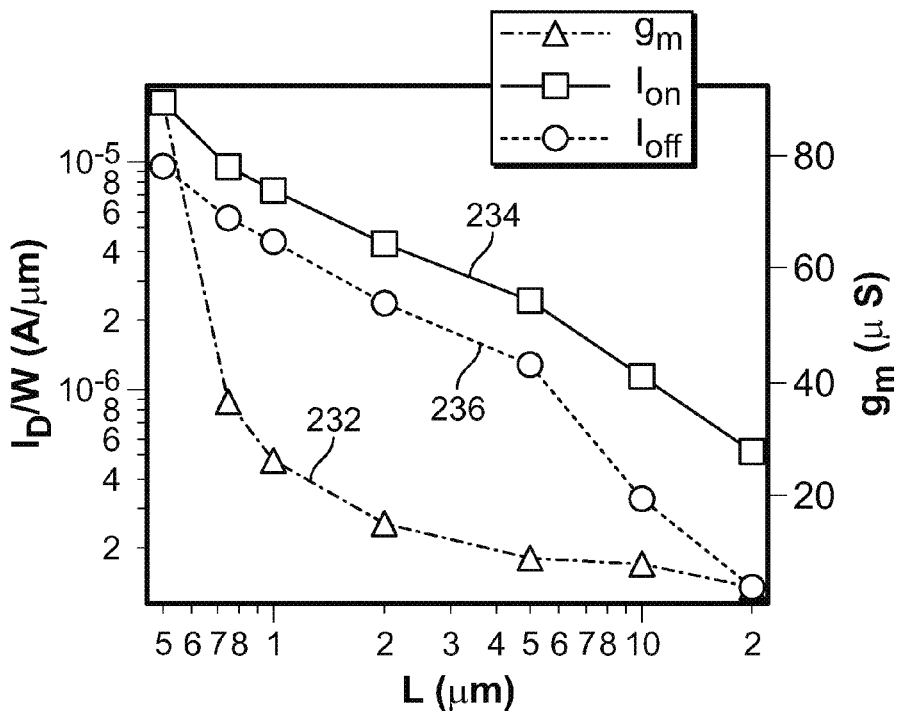

The transconductances ($g_m$) 232 can be calculated from the linear proportion of the transfer curves, as shown in the chart 230 in FIG. 2d. The chart 230 also includes the on-current density $I_{on}$ 234 and the off-current density $I_{off}$ 236. The highest on-current density in a transistor with W=100 μm and L=0.5 μm is up to 20 μA/μm, and gm is close to 100 μS. This on-current density is the highest achieved so far for aligned nanotube transistors, as a result of the submicron channel length we used. The performance of these devices can be improved even further with higher-density nanotubes.

To improve the on/off ratio ($I_{on}/I_{off}$), controlled electrical breakdown is used to remove metallic and high-leakage semiconducting nanotubes. In some implementations, an automated electrical breakdown process is implemented by setting target on/off ratio and on-current, and then using computer control to perform multiple steps of breakdown until the target values were reached. This process, when combined with an automatic probe station, can make electrical breakdown fairly practical for wafer-scale processing. The backgate is set to 15 V to turn off the desired semiconducting nanotubes, while the source/drain voltage ($V_{ds}$) is swept from 0 to −35 V to electrically stress and break the undesired tubes.

Figure 2E:
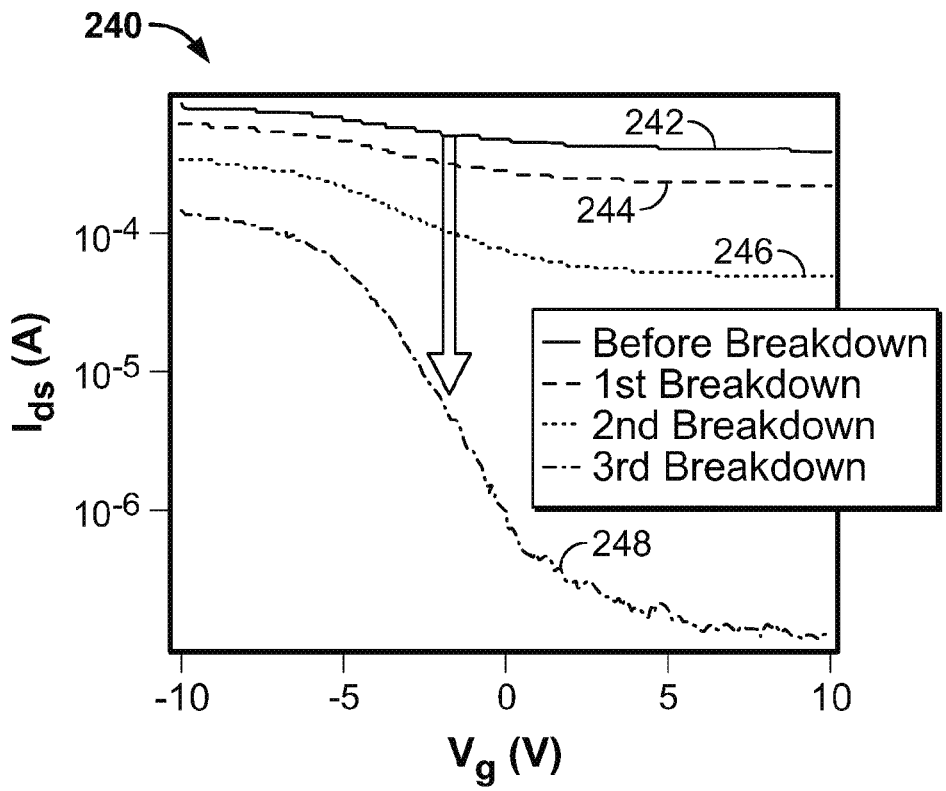

The chart 240 in FIG. 2e shows that the $I_{on}/I_{off}$ of a transistor with W=100 μm and L=0.75 μm significantly increases from ~2 to $10^3$ with multiple steps of electrical breakdown, accompanied by a moderate degradation of the on-current. The multiple steps include: before breakdown 242, first breakdown 244, second breakdown 246 and third breakdown 248.

Figure 2F:
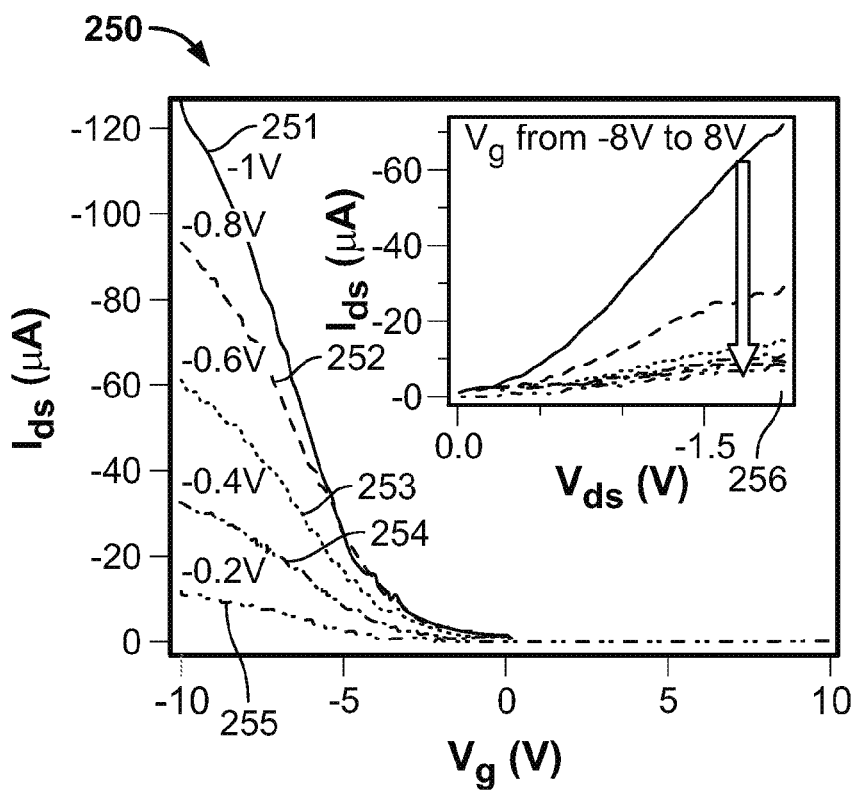
Figure 2G:
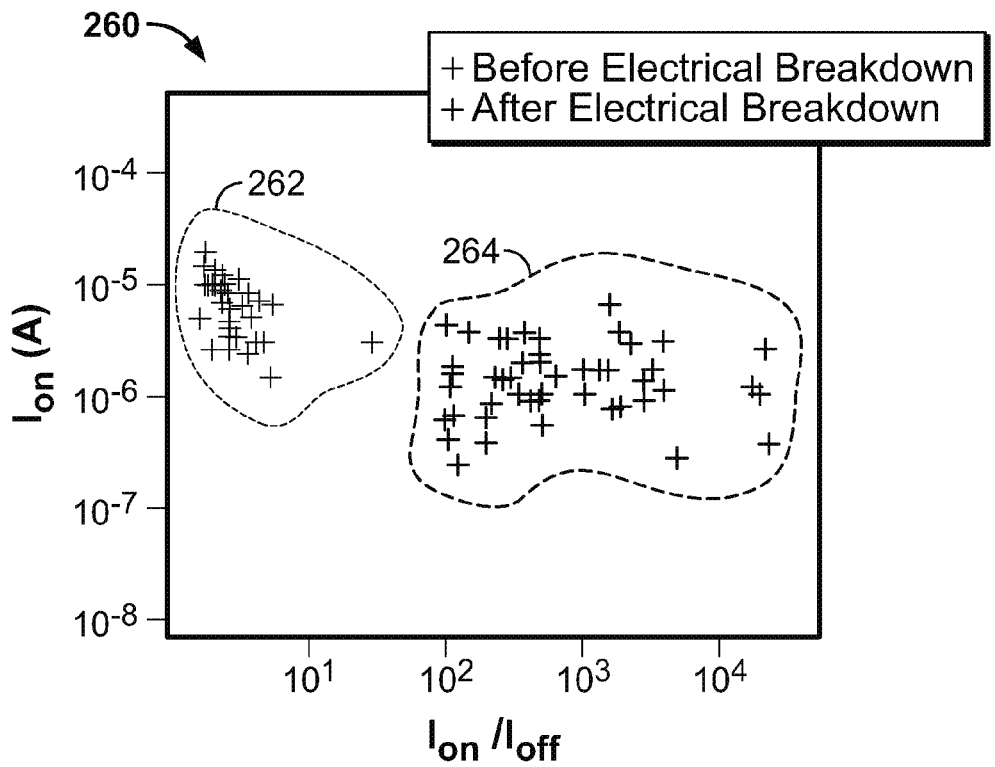

After electrical breakdown, chart 250 and inset 256 in FIG. 2f show the $I_{ds}$-$V_g$ curves 255, 254, 253, 252 and 251 at different $V_{ds}$ from −0.2 to −1 V and $I_{ds}$-$V_{ds}$ curves at different $V_g$ from −8 to 8 V. The chart 260 in FIG. 2g shows a statistical study of about 50 devices from about 10 chips with L=0.75 μm and various W before and after electrical breakdown, where the on-state current density is plotted verses the on/off ratio. $I_{on}$ is measured at $V_{ds}$=1 V and $V_g$=−10 V, and $I_{off}$ is measured at $V_{ds}$=1 V and $V_g$=10 V. Before breakdown 262, the devices exhibited on/off ratios in the range of 1 to 10, due to the presence of metallic nanotubes. In contrast, after electrical breakdown 264, the on/off ratios underwent significant improvement to the range of $10^2$ to $10^5$ with narrow on-state current distribution, which can be used as building blocks for the following nanotube circuits.

Figure 2H:
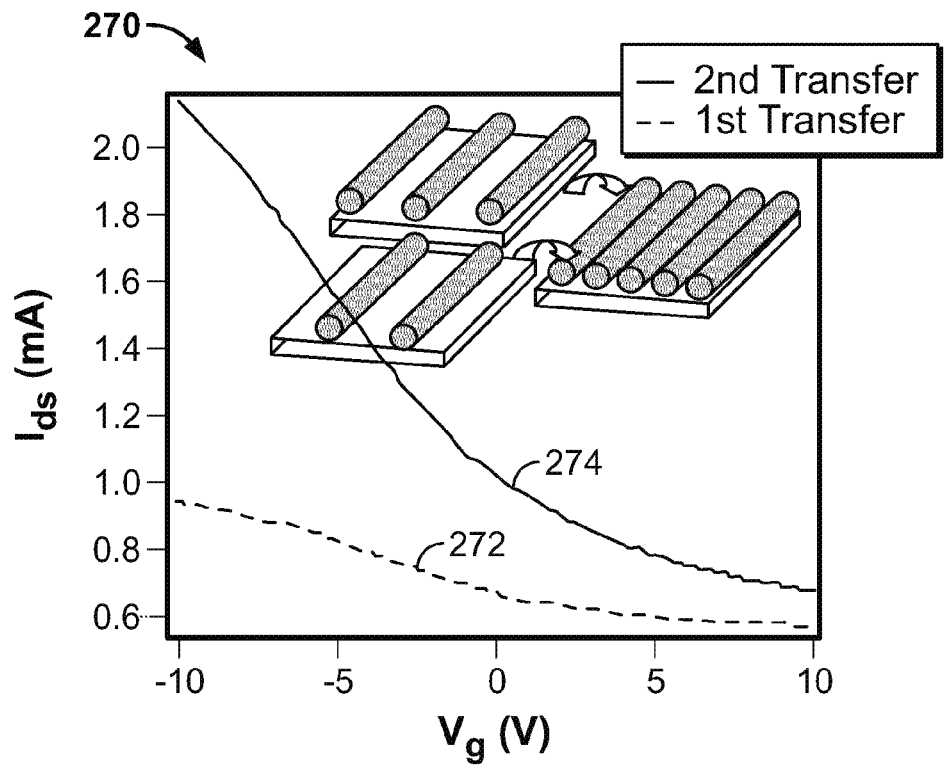

In addition to the tuning of the on/off ratio using electrical breakdown, the transistor conductance can be adjusted by performing multiple steps of nanotube transfer to increase the tube density. The chart 270 in FIG. 2h shows the $I_{ds}$-$V_g$ curves 272 and 274 of two representative devices, with one and two steps of transfer, respectively. Devices fabricated in the double transfer region can show ~2.2 times more current per unit width in FIG. 2h. Multiple nanotube transfer is a novel technique to compensate the decreased current after electrical breakdown, and additional transfers can be performed to achieve even higher current densities.

Besides the back-gated devices, top-gated devices can be fabricated by defining top-gate electrodes on back-gated devices. Compared with the common back-gate devices, the top-gate structure has an intrinsic benefit such as individual control of each transistor in a nanotube circuit. In order to make the top-gate electrodes, the pattern can be formed using photolithography, 50 nm $Al_2O_3$ can be deposited using atomic layer deposition (ALD) as top-gate dielectric, and 5 nm Ti/45 nm Pd can be deposited as the top-gate electrodes, followed by lift-off process.

Figure 3A:
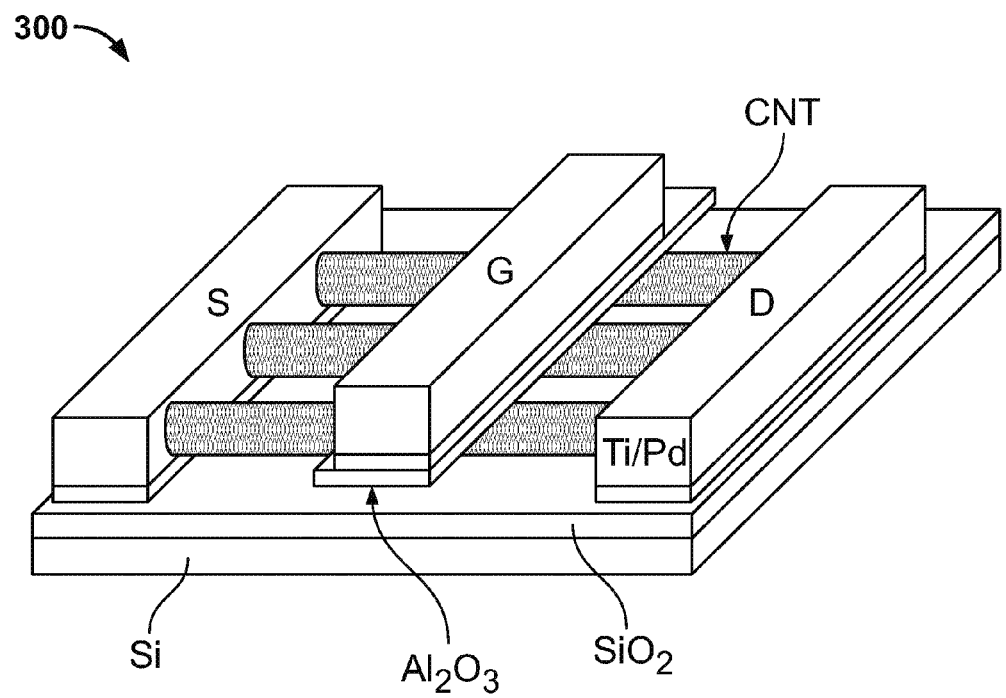
FIGS. 3a-h show examples of top-gated transistors for doping and truly integrated CMOS inverters.
Figure 3B:
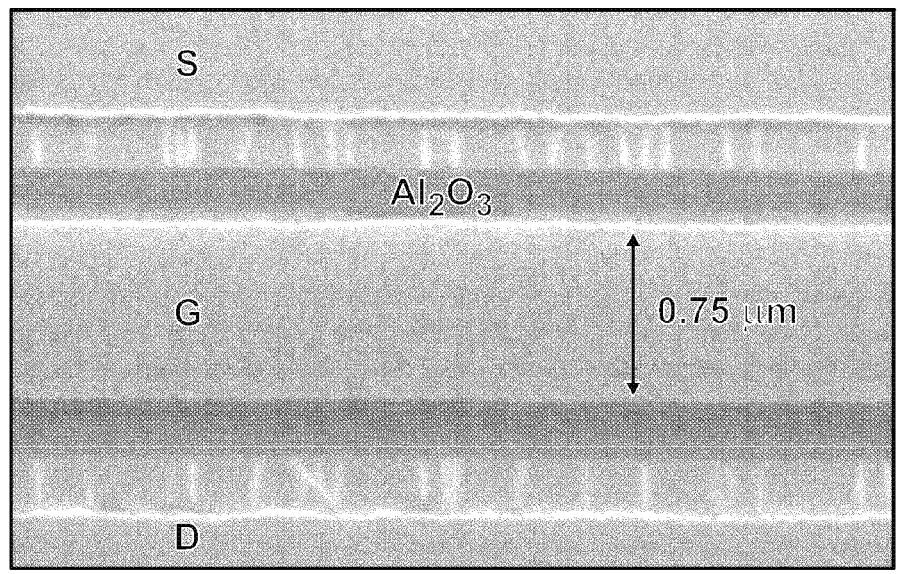
Figure 3C:
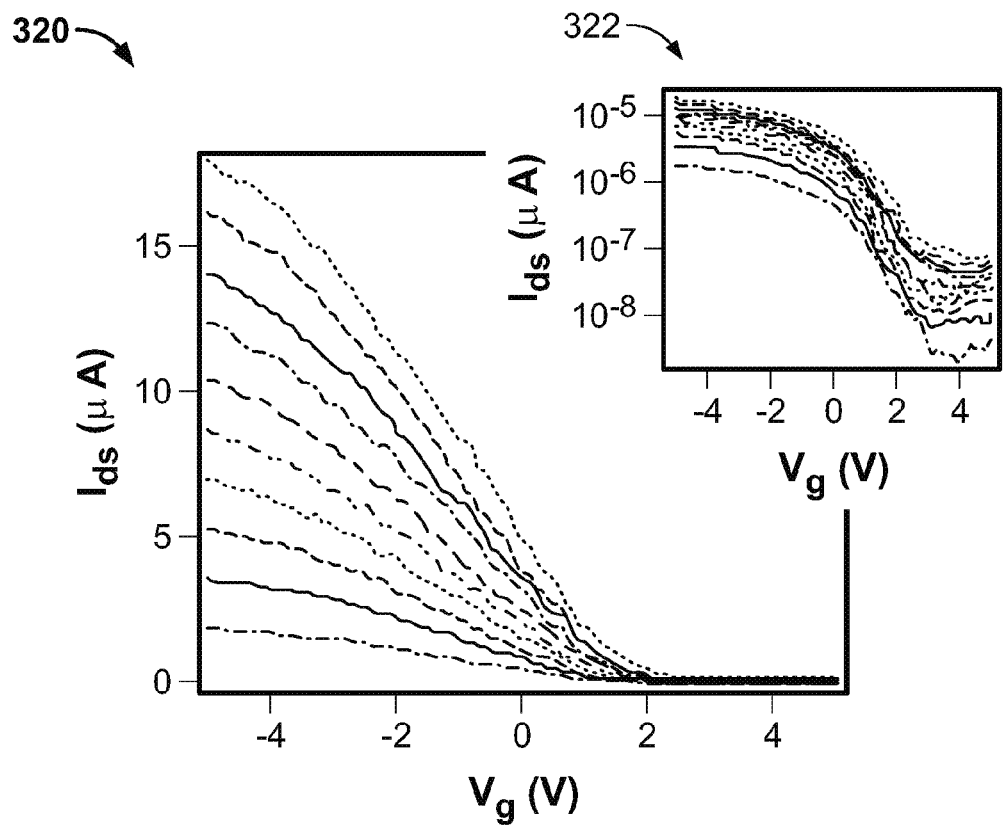
Figure 3D:
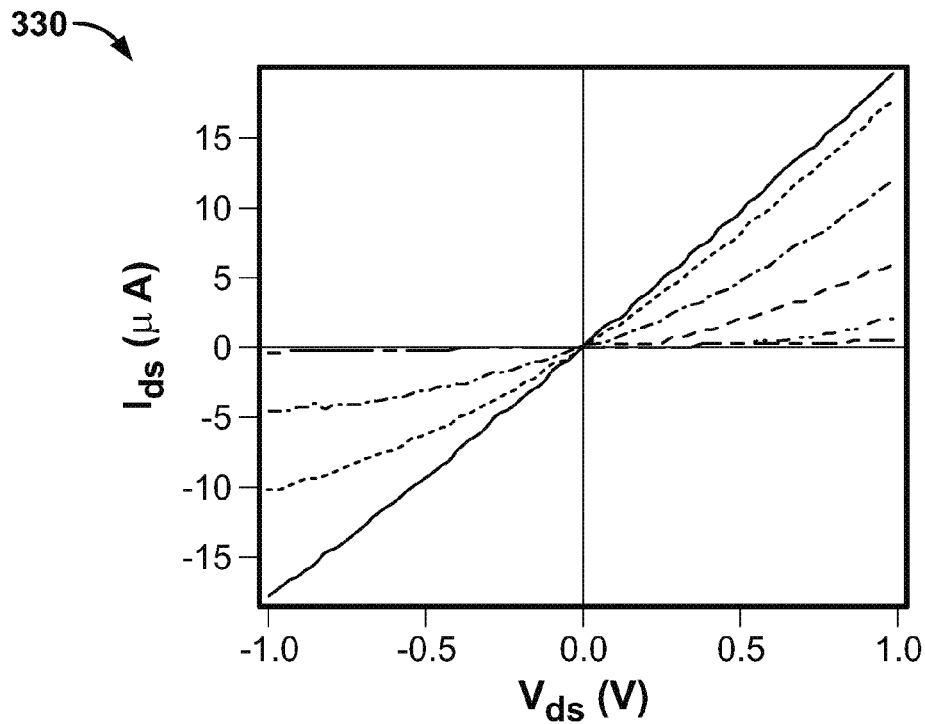

FIG. 3a shows an example schematic diagram 300 of a top-gated device, where top gate partially covers the active channel so that nanotubes can be exposed to n-type dopants such as potassium. FIG. 3b shows an SEM image 310 of nanotubes that bridge between S/D electrodes and are partially covered by $Al_2O_3$ and top-gate. FIG. 3c includes a chart 320 and an inset 322 that show the typical transfer characteristics ($I_{ds}$-$V_g$ curves) for a transistor with W=25 μm, L=3 μm, and top-gate length=1 μm after proper electrical breakdown. FIG. 3d shows the typical output characteristics ($I_{ds}$-$V_{ds}$ curves) for a transistor with W=25 μm, L=3 μm, and top-gate length=1 μm after proper electrical breakdown. The $I_{ds}$-$V_{ds}$ curves appear to be very linear, indicating that ohmic contacts are formed between the electrodes and the nanotubes. The on-current is measured to be 20 μA, corresponding to a current density of 0.8 μA/μm, and the on/off ratio exceeds 104. Such devices can be used in doping study as described below.

Characteristics of CMOS circuits can include low static power consumption. Significant power is drawn when the CMOS circuits are switching between on and off states. Unlike doping in silicon CMOS processes, nanotubes can not be easily doped via ion implantation. The ability to obtain both p- and n-type nanotube FETs can be important to construct complementary electronics. A p-type nanotube device can be doped electrostatically, substitutionally, or via charge transfer to convert it into an n-type one. Four different methods, with potassium and electrostatic doping for top-gated devices, and polyethilenimine (PEI) and hydrazine ($N_2H_4$) for back-gated ones, are described to produce n-type transistors and to evaluate the most practical way for integrated circuits.

Figure 3E:
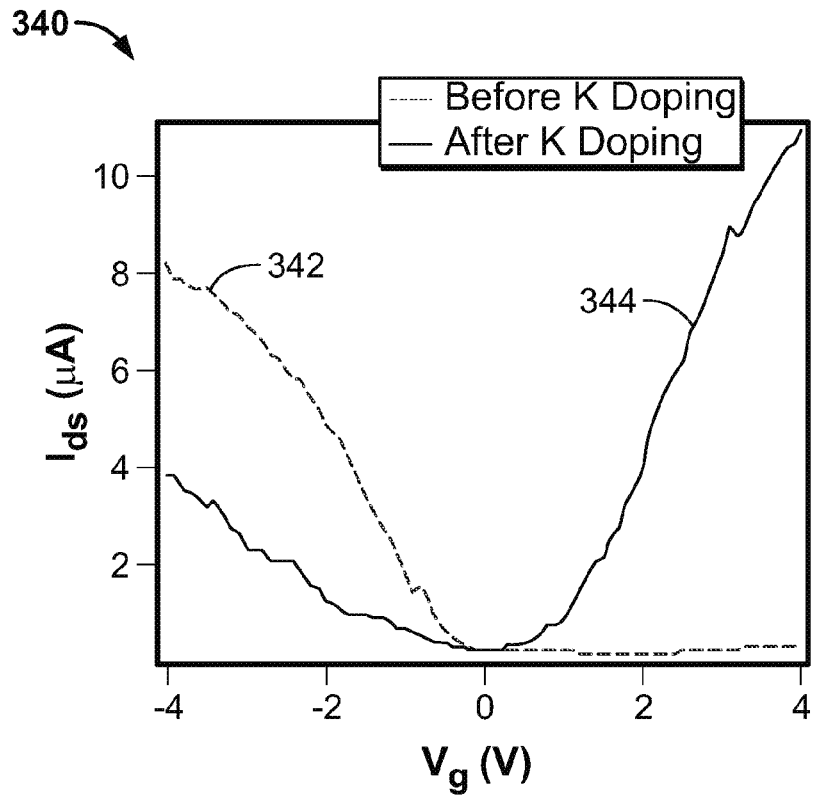
Figure 3F:
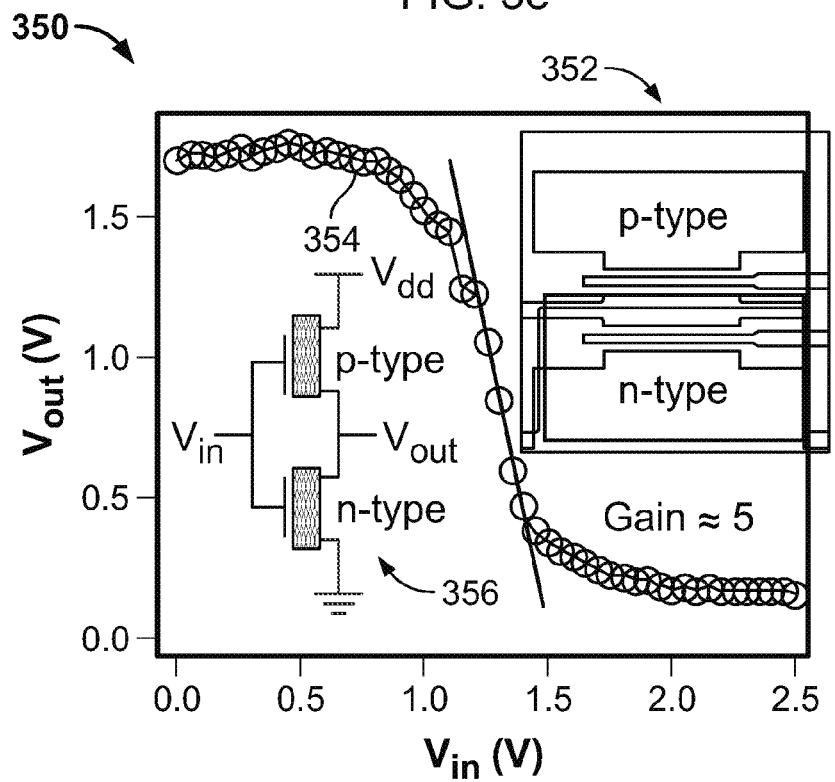

In order to dope nanotube devices with potassium, polymethylmethacrylate (PMMA) can be spin-coated as a capping layer for p-type transistor, and then the window can be opened up for other devices which can be altered into n-type after doping, as shown in the chart 350 and the inset 352 of FIG. 3f. This device can be loaded into high vacuum (~10-5 torr), followed by the evaporation of potassium. FIG. 3e is a chart 340 that shows the $I_{ds}$-$V_g$ characteristics of the top-gated transistor before 342 and after 344 potassium doping. This doping produces n-type transistor by shifting the Fermi level of nanotubes to the conduction band, and the conductance of the transistor increases at positive gate voltage. The potassium doping can be advantageous over other doping methods such as PEI showing low on-off ratio, and $N_2H_4$ with toxicity and difficulty in integration. Armed with potassium doping, a truly integrated CMOS aligned nanotube inverter can be generated. For example, the integrated CMOS aligned nanotube inverter includes the p-type and n-type transistors residing on one chip and located side by side.

FIG. 3f includes the voltage transfer characteristics (VTC) 354, the schematic diagram 356, and the photo image 352 of the CMOS inverter. The inverter as described in this specification can be operated with a $V_{DD}$=2 V and an input voltage range from 0 to 2.5 V. The gain deduced from the VTC data 354 is 5, which can be high enough to drive a more complicated logic circuit such as a ring oscillator.

Figure 3G:
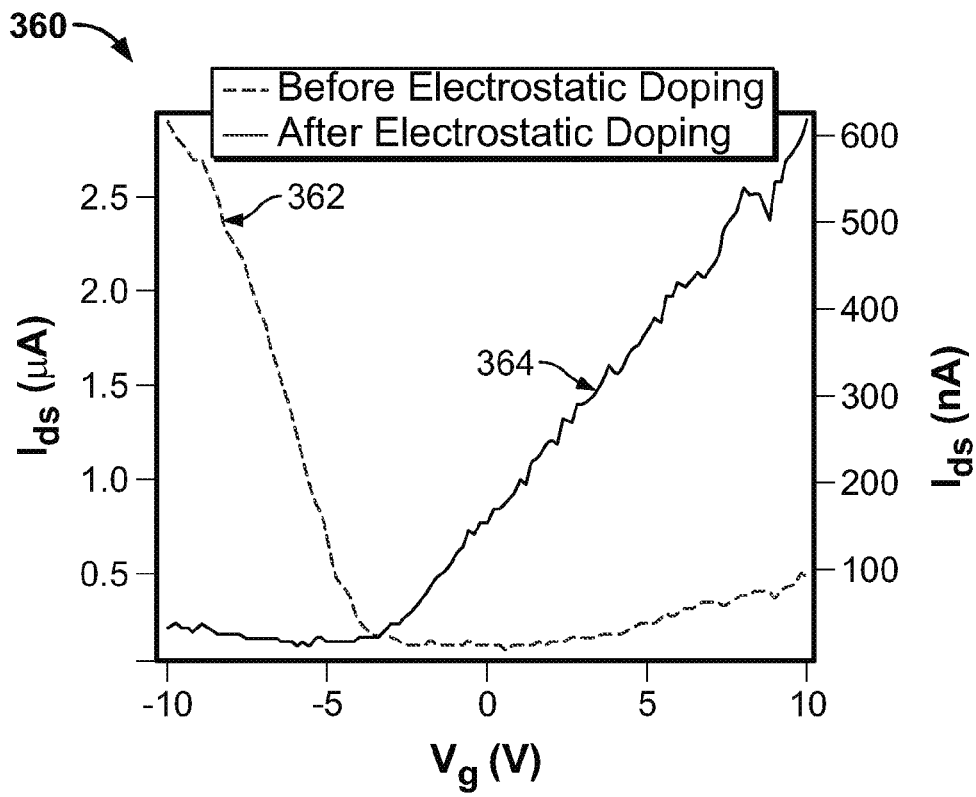
Figure 3H:
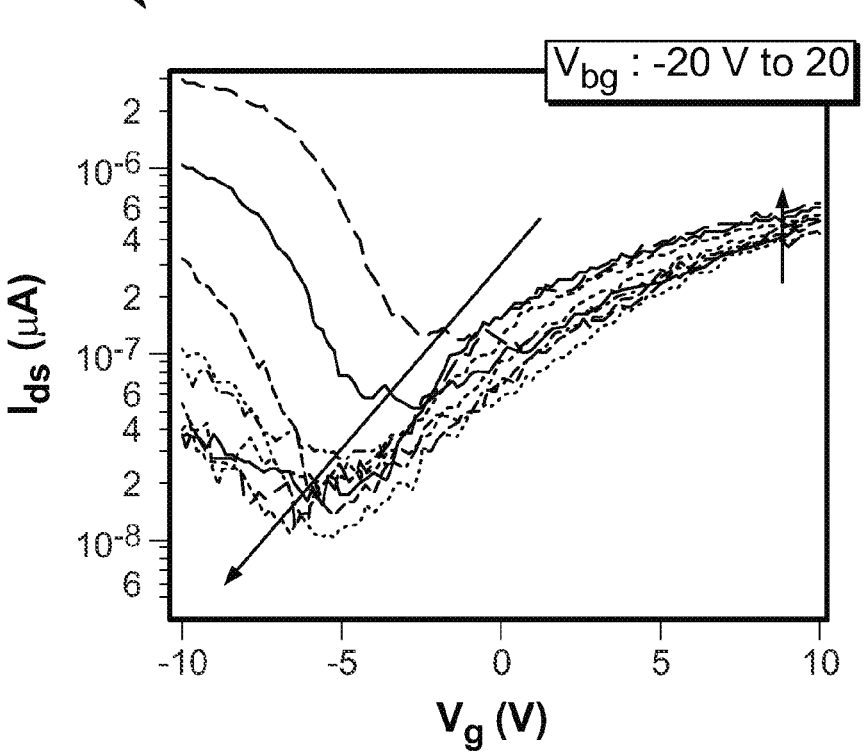

In addition to potassium doping, electrostatic doping are studied on top-gated transistors with Si common back-gate. Electrostatic doping effects can be utilized in the dual-gate nanotube FET to obtain the polarity control (p or n) and to tune the threshold voltage of FET. The chart 360 in FIG. 3g exhibits the current-gate voltage (I-$V_g$) characteristics of the dual-gated transistor, and shows p- and n-type properties at back-gate voltage ($V_g$)=−20 V and 20 V, respectively, which can be understood as follows. For sufficiently negative (or positive) back-gate voltage, the Schottky barriers are thinned enough to allow for hole (or electron) tunneling from the metal contact into the nanotube, and thus the nanotube channel can be electrostatically doped into p-type or n-type. Line 362 shows the data before electrical doping and line 364 shows the data after electrostatic doping. Therefore, varying the top gate voltage can switch on and off the transistor with assist of back-gate voltage, which determines the type of majority carrier and the device on-current. In the device as described in this specification, the n-type conduction is slightly lower than the p-type conduction, which is attributed to asymmetrical Schottky barrier heights for holes and electrons, and environmental doping effect from $O_2$ and moisture. In addition, the current verses the top-gate voltage (I-$V_g$) is measured at different back-gate $V_g$ from −20 to 20 V, and a significant shift of threshold voltage and enhancement of n-type conduction are observed from 0 to −6 V, as shown in the chart 370 in FIG. 3h. Compared with other doping methods such as potassium and hydrazine, which are not stable in air, the electrostatic doping is stable and tunable, but requires sophisticated device structure and circuit design.

Figure 4A:
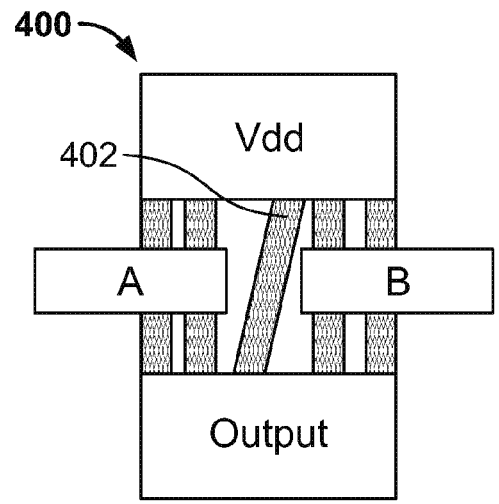
FIG. 4a-g show examples of PMOS NOR and NAND gates with top-gated transistors.
Figure 4B:
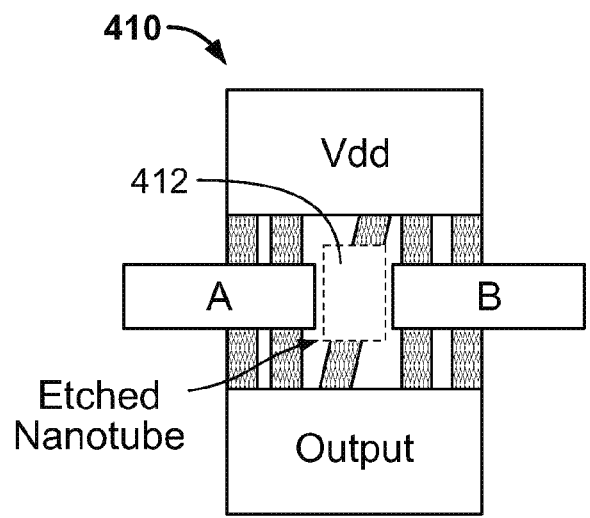
Figure 4C:
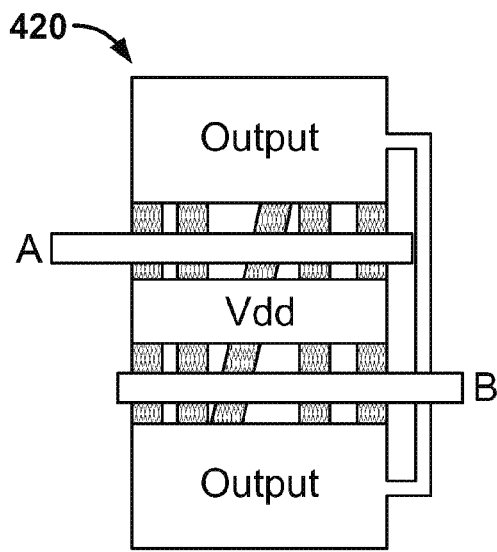

Based on top-gated aligned nanotube transistors, more sophisticated PMOS circuits can be implemented. However, there may be misaligned or misoriented nanotubes in these devices that can result in incorrect logic behavior. Techniques, apparatus and system are described to implement a defect-tolerant structure to guarantee the correct logic behavior. The defect-immune circuit layouts can be implemented for PMOS NOR and NAND circuits. FIGS. 4a-c show defect-influence layout, and two defect-tolerate layouts with transistors connected in parallel, respectively. In FIG. 4a, the diagram 400 shows misaligned nanotubes 402 outside the gates A and B that are not under the control of either gate and therefore may impair the logic operation. In FIG. 4b, the nanotubes 412 lying between gates A and B can be removed using oxygen plasma etching, and thus this design is immune to such misaligned nanotubes. Furthermore, FIG. 4c represents an even better design, where two transistors controlled by gates A and B are connected in parallel and utilize the same bunch of aligned nanotubes. This design can allow virtually identical device performance between two parallel transistors.

Figure 4D:
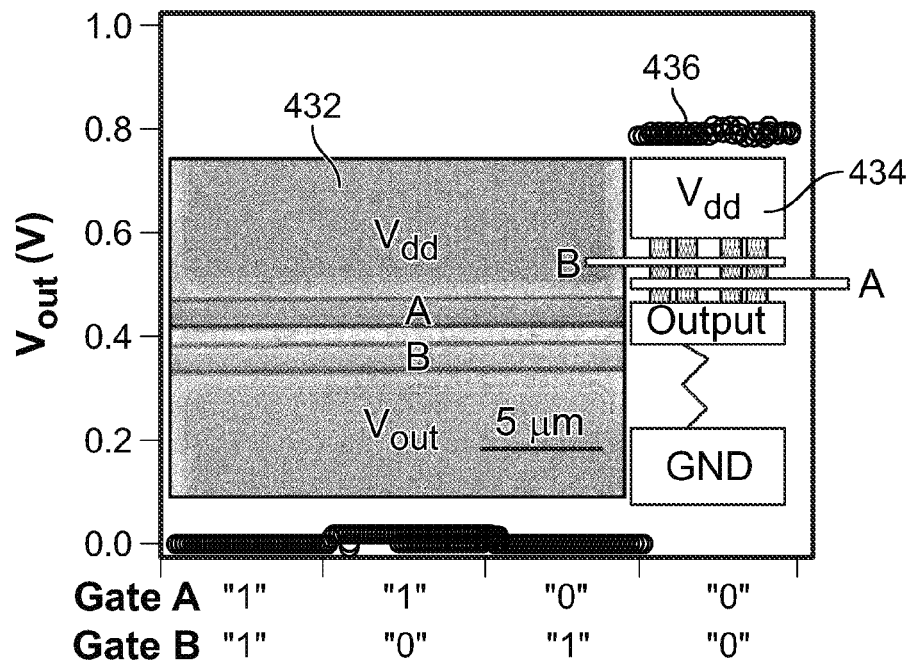
Figure 4E:
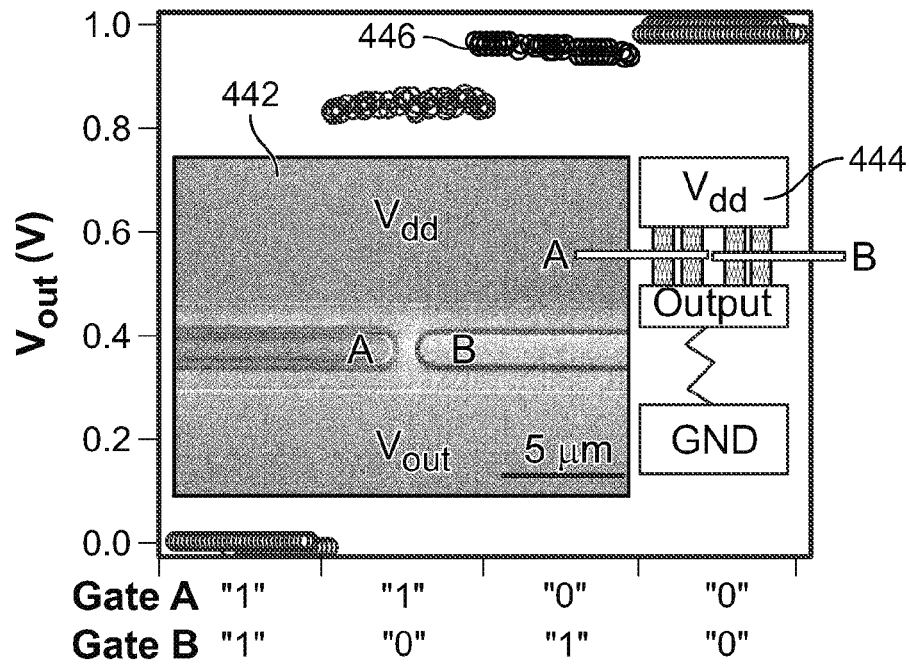
Figure 4F:
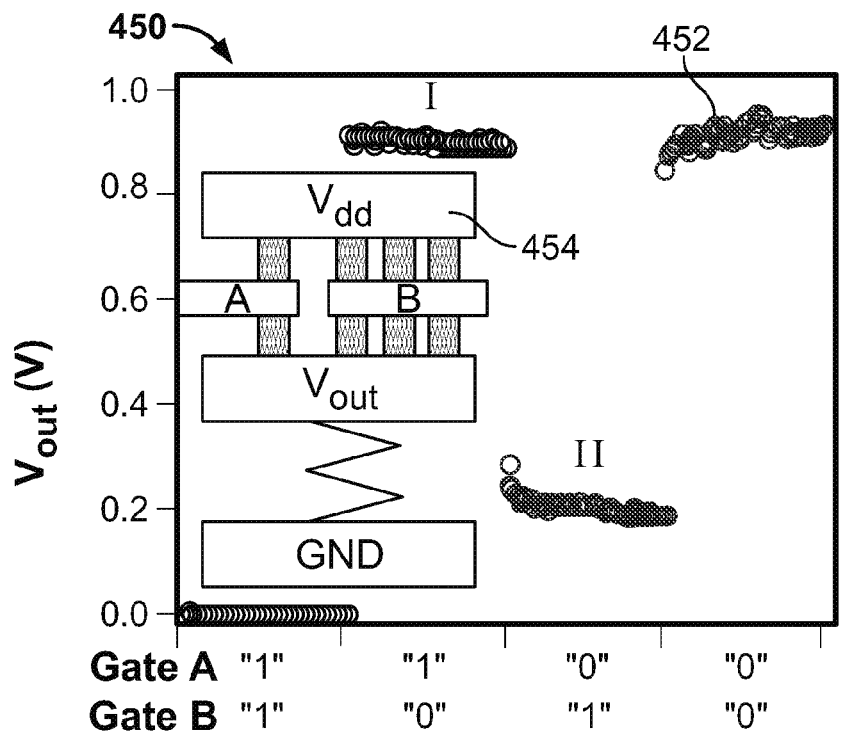
Figure 4G:
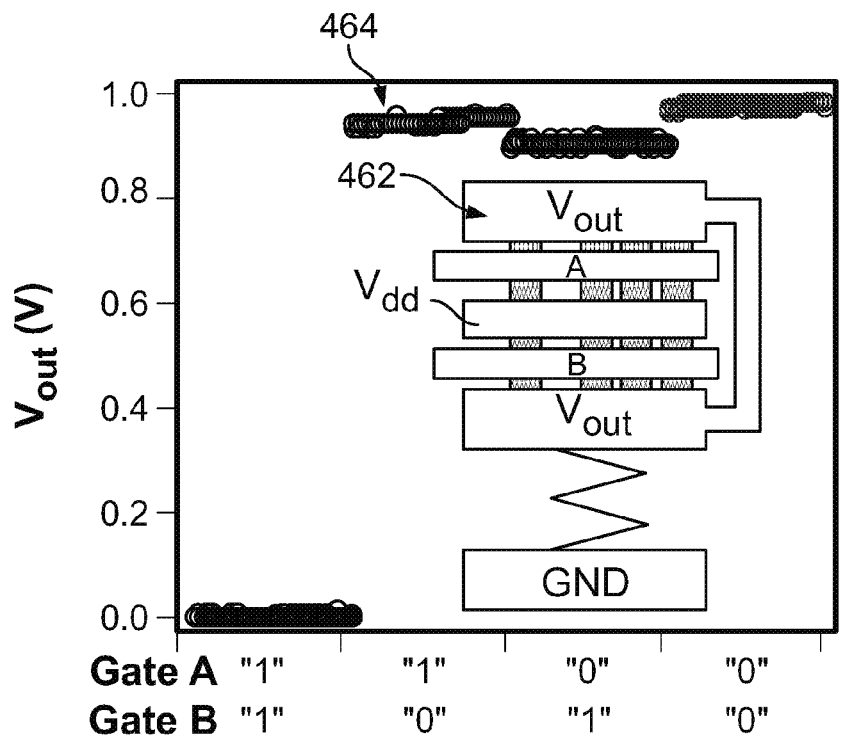

PMOS circuits can be fabricated using the defect-immune layout. FIGS. 4d and 4e show SEM images 432 and 442 of the integrated pull-up networks, the schematic diagrams 434 and 444, and the output characteristics 436 and 446 for PMOS NOR and NAND, respectively. 20 MΩ resistive load can be chosen so that it is between the on-state resistance and the off-state resistance of the transistors. The NAND and NOR circuits can be both operated with a $V_{DD}$ of 1V. 10V and −10V applying on gates A and B are treated as logic "1" and "0," respectively. For the NAND, the output is "1" when either one of the two inputs is "0," while for the NOR, the output is "0" when either one of the two inputs is "1." These output characteristics confirm that the circuits described in this specification realized the logic function correctly. However, the design in FIG. 4b may suffer from the problem of having nonuniform nanotube density and consequently different characteristics for gates A and B. FIG. 4f shows the output data 452 and schematic diagram 454 of a PMOS NAND gate, where the nanotube density happened to be nonuniform. The outputs are asymmetric between the point I and II, and also the transfer characteristics for gates A and B show a significant difference in terms of on-current. The low output at point II is attributed to the relatively large DC current leakage through the pull-down resistor, which is comparable to the on-current of transistor controlled by gate A. In contrast, for the NAND with design shown in FIGS. 4c and 4g inset 462, the transistor transfer characteristics and the outputs 464 of circuits are more symmetric than the ones in FIG. 4f. This confirms that the NAND design in FIG. 4c performs the logic function correctly even with nonuniform nanotube density and misaligned nanotubes.

While PMOS logic is easy to design and manufacture, it has several shortcomings as well. For example, the current flows through the pull-down resistor when the pull-up network is active, as discussed above. This can lead to static power dissipation even when the circuit sits idle. In order to overcome such problem, CMOS nanotube circuits can be implemented using the defect-tolerant design with individual back-gates for efficient chemical doping. Specifically, the individual back-gated devices have relative advantages over the top-gated ones, such as easy chemical doping and electrical breakdown owing to the fully exposed device structure. For the individual back-gated devices, individual back-gate electrodes can be defined on Si/$SiO_2$ wafer via photolithography, 5 nm Ti/45 nm Au deposition, and a lift-off process. 50 nm ALD $HfO_2$ can be deposited as the gate-dielectric, and then the aligned nanotubes can be transferred. Finally, the source/drain electrodes can be formed.

Figure 5A:
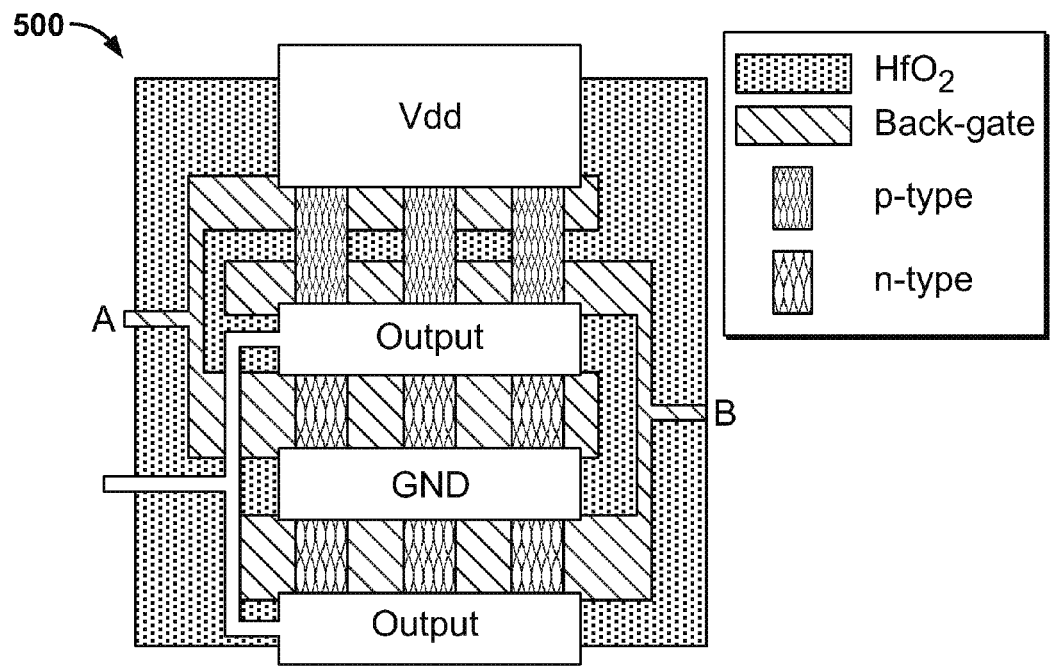
FIGS. 5a-f show examples of defect-tolerant CMOS NOR and NAND with individual back-gated transistors.
Figure 5B:
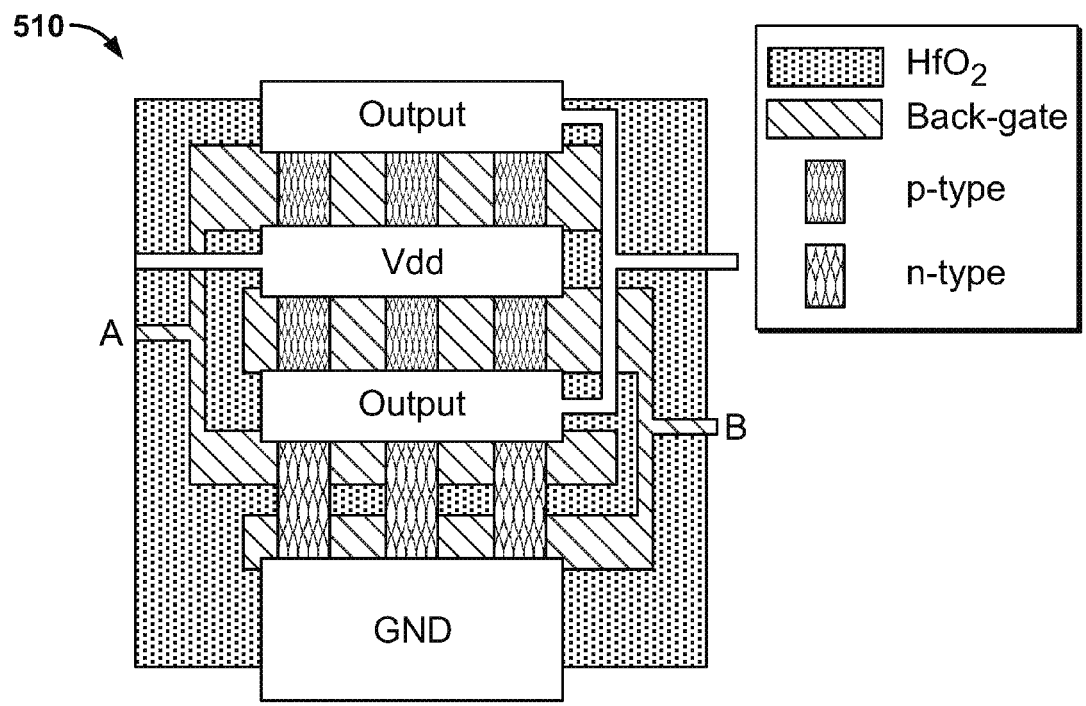
Figure 5C:
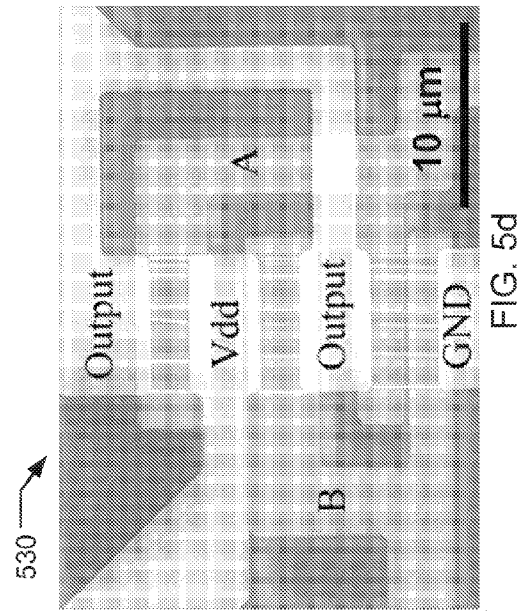
Figure 5E:
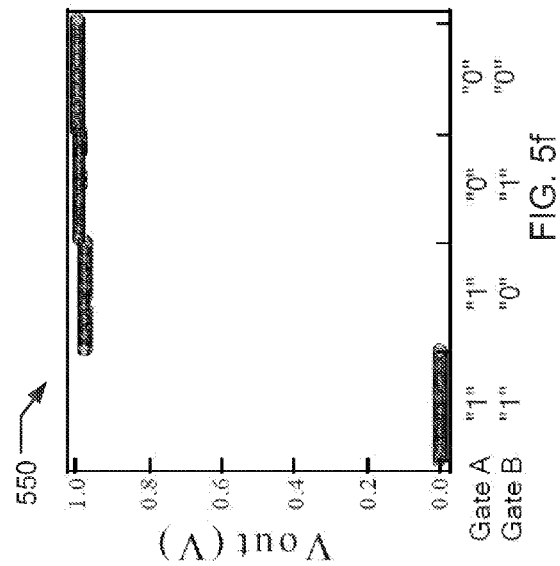
Figure 5D:
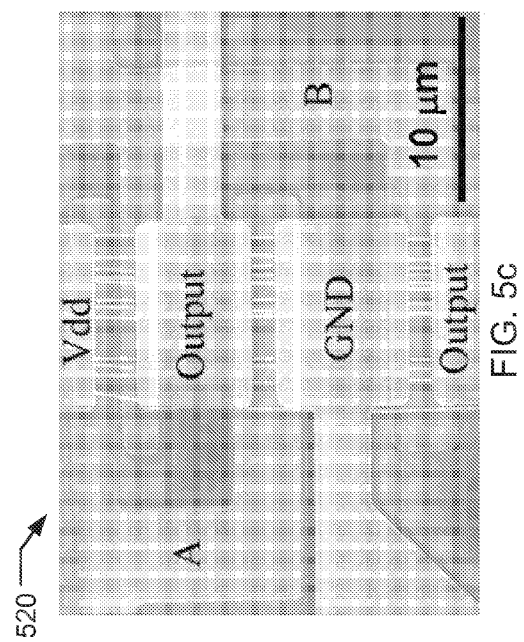
Figure 5F:
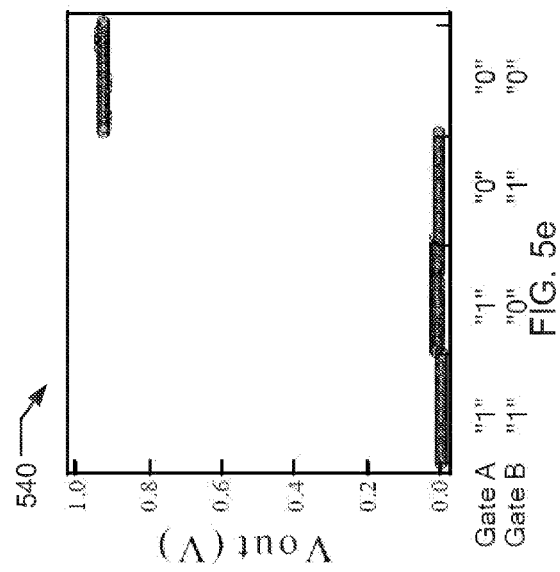

FIG. 5a is a diagram 500 showing a CMOS NOR device. FIG. 5b is a diagram 510 showing a CMOS NAND device. After the device fabrication, the potassium doping is performed to obtain n-type devices as mentioned in the CMOS inverter study. FIG. 5c shows an SEM image 520 of the CMOS NOR device. FIG. 5d shows an SEM image 530 of the CMOS NAND device. The pull-up and pull-down networks are built on the same nanotube arrays, and the pull-down network is converted from p-type into n-type after potassium doping. Compared with the PMOS circuits, the CMOS logic circuits shows almost ideal performance, where the outputs are close to 0 V or 1.0 V, as shown in charts 540 and 550 in FIGS. 5e and 5f.

The techniques, apparatus and systems as described can be used to perform CMOS-analogous wafer-scale processing of integrated aligned nanotube circuits, including progress on wafer-scale synthesis and transfer of aligned nanotubes, metallic nanotube removal and chemical doping, and defect-tolerant integrated nanotube circuits. Synthesis of massive aligned nanotubes can be achieved on complete 4 inch quartz and sapphire substrates, followed by successful transfer of the nanotubes to 4 inch Si/$SiO_2$ wafers. CMOS analogous fabrication is performed to yield transistors and circuits with features down to 0.5 μm, with high current density ~20 μA/μm and good on/off ratios. In addition, extensive chemical doping is used to build fully integrated complementary inverter with a gain ~5. Also, defect-tolerant designs are implemented for NAND and NOR gates.

Figure 6:
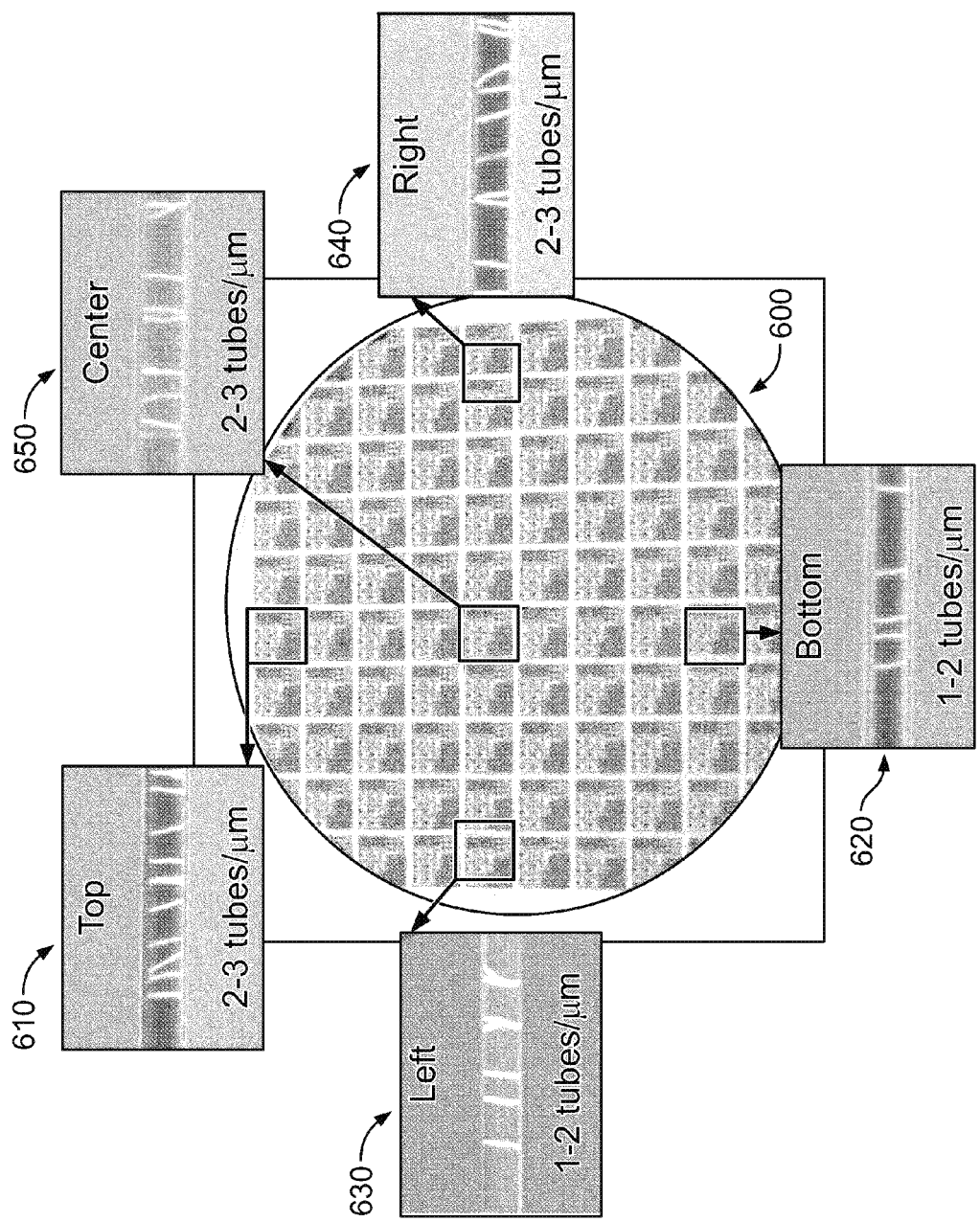
FIG. 6 shows an example of a 4 inch quartz wafer with aligned nanotubes and patterned electrodes.

FIG. 6 shows an example of full wafer-scale aligned nanotube synthesis on 4 inch quartz wafers 600. Aligned nanotubes can be synthesized on 4 inch quartz wafers and source/drain electrodes can be patterned, as shown in FIG. 6. SEM images of the top 610, bottom 620, left 630, right 640 and center 650 confirm that aligned nanotubes are successfully grown with uniform density on the entire quartz wafer. The samples used for the device study have typical nanotube density of 2-5 tubes/μm.

As discussed before, multiple times of transfer can be used to increase the nanotube density. However, when the total number of transfers exceeds 2, the layer-by-layer transfer technique may fail because the adhesion between the gold film and the receiving substrate may become week with more than 2 transfers. By using stacking transfer, the adhesion problem can be solved. For example, 4 transfers are described below with increased nanotube density of more than 50 tubes/μm.

Figure 7:
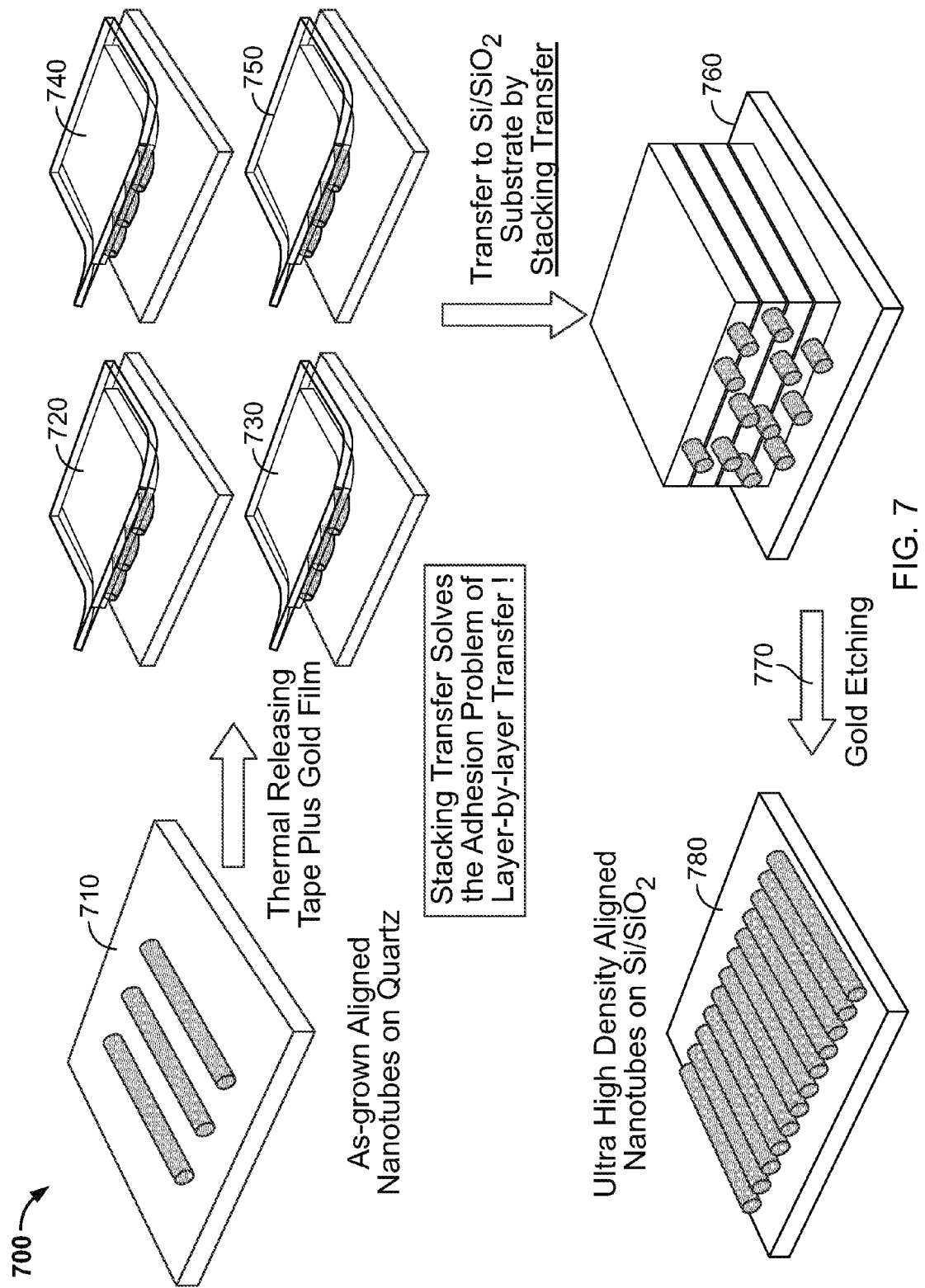
FIG. 7 shows a process of stacking multiple transfers.

FIG. 7 shows an example of a process for stacking multiple transfers. The transfer process is the same as the gold film plus thermal releasing tape transfer technique discussed previously. Diagram 710 shows the as grown aligned nanotubes on quartz. Thermal releasing tape plus gold film are applied multiple times to the aligned nanotubes as shown in 720, 730, 740 and 750. The gold films can be transferred to a $Si/SiO_2$ substrate by stacking the gold films on top of each other as shown in 760. Gold etching can be performed on the stacked gold films together as shown in 770. After the etching process, nanotubes will lay down to the substrate and form ultra high density aligned carbon nanotube network on the receiving substrate as shown in 780.

FIGS. 8a, 8b, 8c and 8d show SEM images before transfer 800, after 1-time transfer 810, after 2-time transfer 820, and after 4-time transfer 830, respectively. The corresponding nanotube densities are 15 tubes/μm, 15 tube/μm, 29 tubes/μm, and 55 tubes/μm, respectively.

In some implementations, n-type transistors can also be achieved by metal contact engineering. Pd, with a large work function, can align with the valence band of the carbon nanotubes, and form ohmic contacts for holes. Consequently, the devices with Pd contacts can exhibit p-type behavior. Thus by using metals with small work function as the electrodes, n-type conduction from the nanotubes can be obtained as well. For example, metal contact engineering can be applied to the above described aligned nanotube platform. Combining small work function metal Gadolinium (Gd) for n-type contact and large work function metal Palladium (Pd) for p-type contact, registration-free fabrication of air-stable n-type aligned nanotube transistors, PN-junctions, and CMOS integrated inverters can be obtained. Other metals with low works functions, (such as Scandium (Sc), Yttrium (Y), Gadolinium (Gd), Dysprosium (Dy), Ytterbium (Yb), or Terbium (Tb), and so on) can work equally well for this purpose.

Figure 9A:
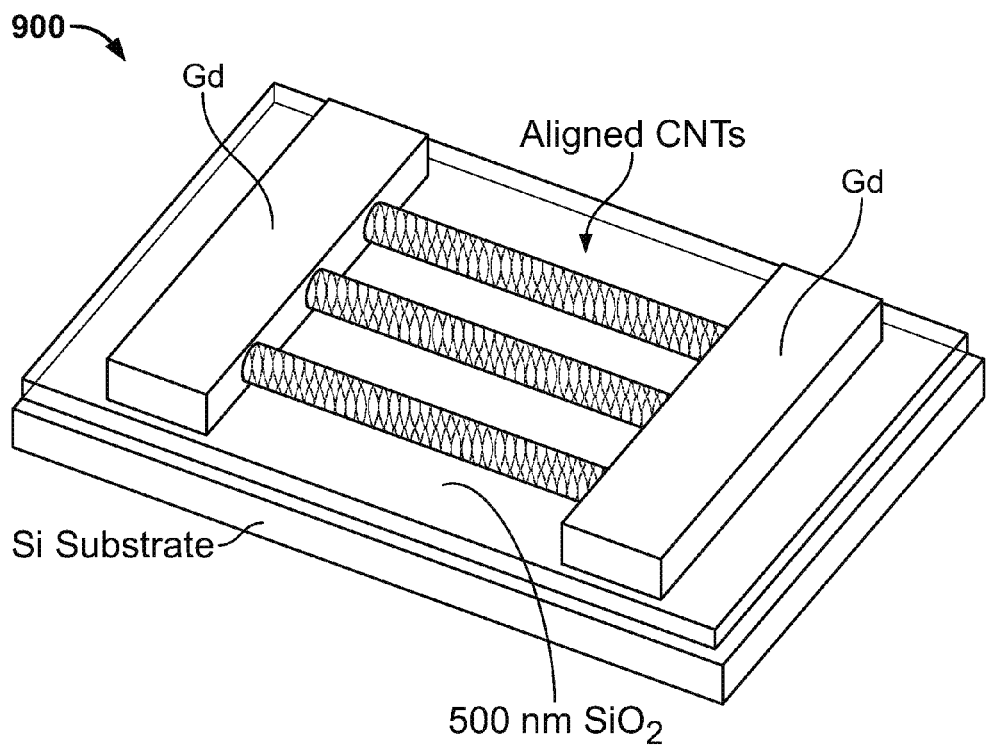
FIG. 9a shows a schematic diagram of an aligned nanotube device.
Figure 9B:
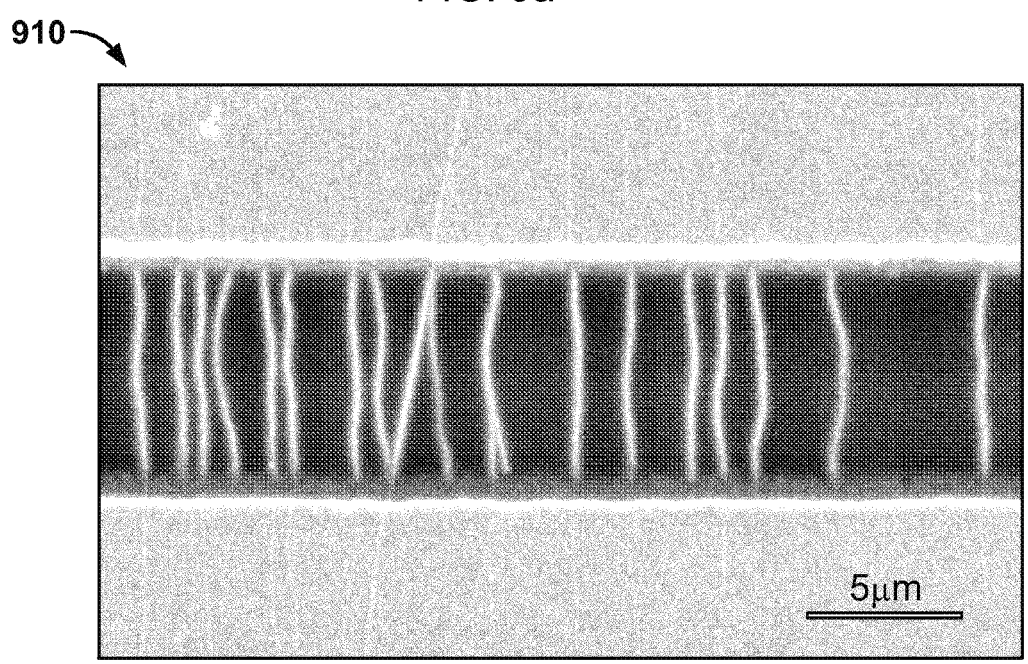
FIG. 9b shows an SEM image of an aligned nanotube device.

70 nm Gd can be deposited by thermal evaporation followed by the lift-off process to form the source and drain metal contacts. FIGS. 9a and 9b show a schematic diagram 900 and an SEM image 910 of above described devices. The electrical properties of the devices can be characterized and all the measurements can be carried out in air. For aligned nanotubes devices, due to the presence of both metallic and semiconductive nanotubes, metallic nanotube removal technique such as electrical breakdown may be needed.

FIG. 9c is a chart 930 that shows the transfer ($I_D$-$V_G$) characteristics of a typical n-type nanotube transistor (L=4 μm, and W=8 μm) measured before and after electrical breakdown. Before breakdown 932, the device exhibits on/off ratio of around 2. After electrical breakdown 934, the on/off ratio is improved to around 1000 with a trade-off with the on-current. FIG. 9d is a chart 940 that shows the transfer characteristics of the device after electrical breakdown measured under different drain voltages. For example, the transfer characteristics are shown for the different drain voltages of $V_D$=1.0 V 941, 0.8 V 942, 0.6 V 943, 0.4 V 944 and 0.2 V 945. FIG. 9e is a chart 950 that shows output characteristics ($I_D$-$V_D$) of the devices measured under different gate voltages. For example, the output characteristics are shown for gate voltages of −10 V 961, −9 V 960, −8 V 959, −7 V 958, −6 V 957, −5 V 956, −4 V 955, −3 V 954, −2 V 953, −1 V 952 and 0 V 951. From the transfer characteristic, one can find that the transistor exhibits clear n-type behavior. The output characteristics appears to be very linear for $V_D$ smaller than 1V, indicating that ohmic contacts are formed between the Gd electrodes and the nanotubes. Under higher $V_D$, the device exhibits saturation behavior which indicates nice field-effect operation.

Figure 10A:
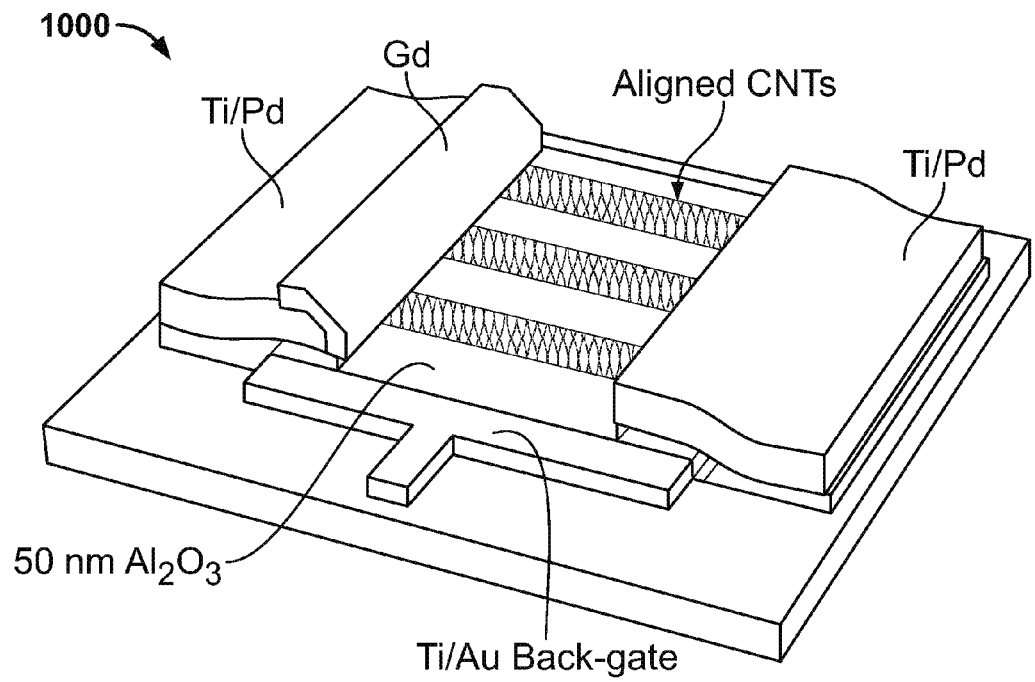
FIGS. 10a, 10b and 10c show a schematic diagram, optical microscope image and SEM image (with artificial color) of a diode device.
Figure 10B:
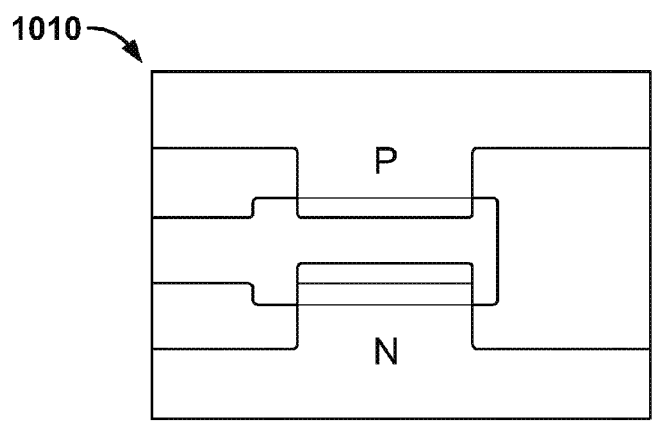
Figure 10C:
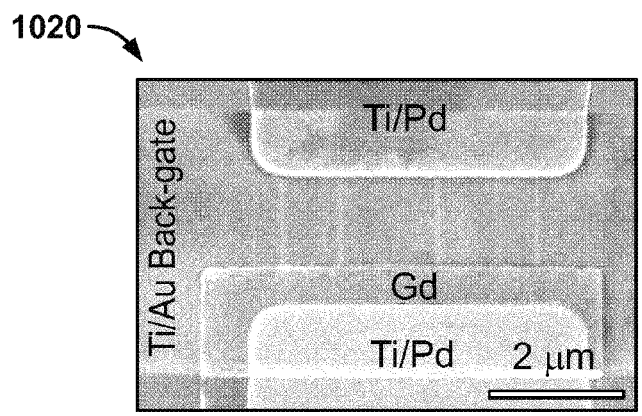

Using similar approach, diode devices can also be achieved. FIGS. 10a, 10b and 10c show a schematic diagram 1000, an optical microscope image 1010 and an SEM image (with artificial color) 1020 of a diode device. The device fabrication is similar to the above mentioned n-type transistor, except that the Gd extension is patterned to one of the electrodes but not the other. In this case, Pd can align with the valence band and form ohmic contact for holes at one terminal, and Gd can align with the conduction band and form ohmic contact for electrons at the other terminal. This can result in the PN-junction.

Figures 10D, 10E, 10F:
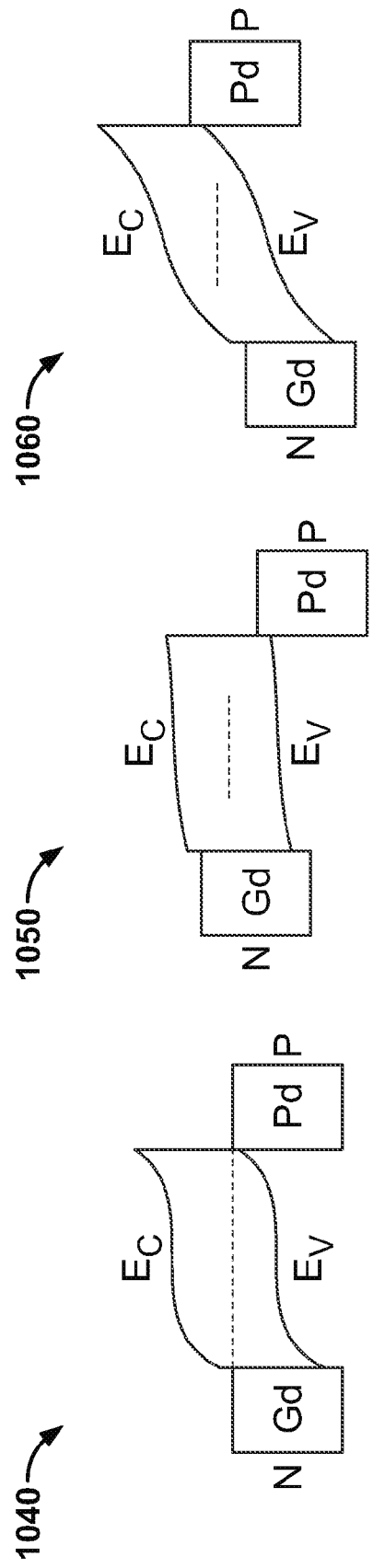
FIGS. 10d, 10e and 10f show energy band diagrams in equilibrium; forward-bias and reverse-bias respectively.

FIGS. 10d, 10e and 10f show the corresponding energy band diagrams in equilibrium 1040, forward-bias 1050 and reverse-bias 1060 respectively. With positive voltages applied to the p-side, the device operates in the forward-bias region and the barrier height reduces. Consequently, current flow increases exponentially with the applied positive bias voltage. In contrast, with negative voltages applied to the p-side, the device operates in the reverse-bias region and the barrier height increases, preventing the current from flowing.

Figure 10G:
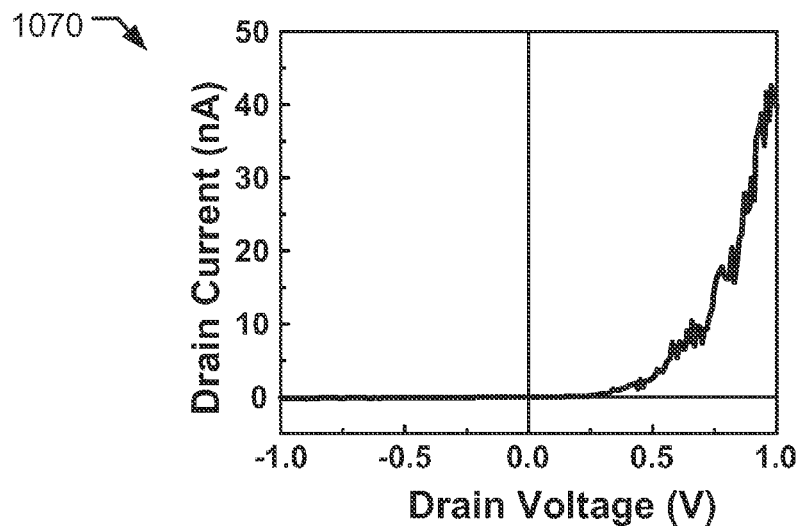
FIG. 10g shows two-terminal I-V characteristics of a PN-junction in linear scale, which exhibits clear rectifying behavior.
Figure 10H:
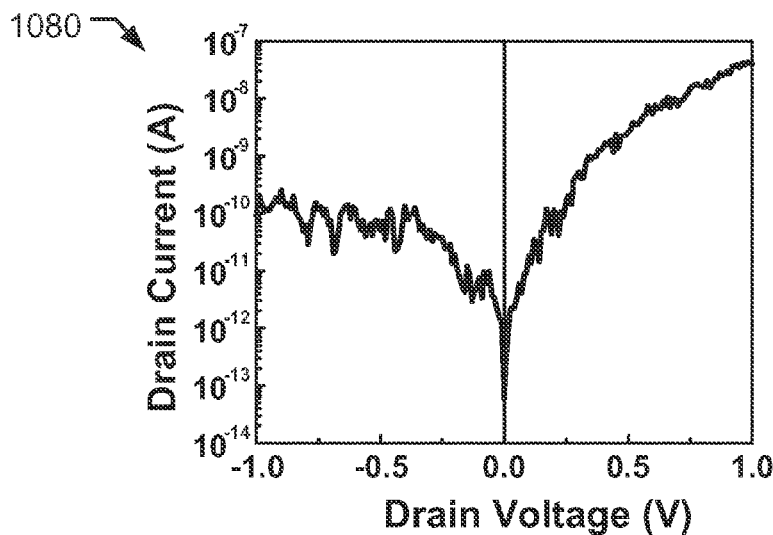
FIG. 10h shows two-terminal characteristics of a PN-junction shown in logarithm scale, which exhibits clear rectifying behavior.
Figure 10I:
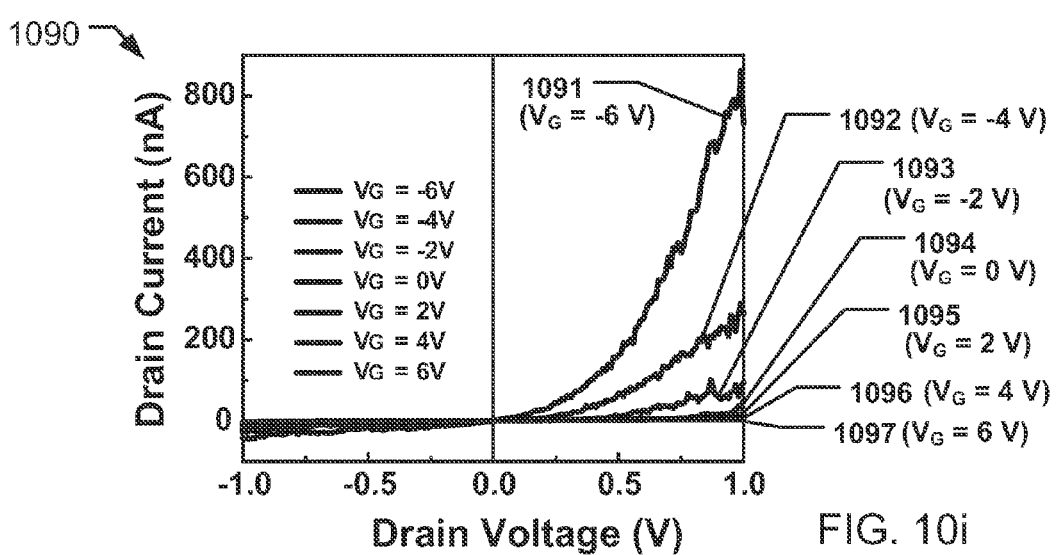
FIG. 10i shows gate dependence of I-V characteristics of a diode.

The above-mentioned processes translate into the two-terminal I-V characteristic of the PN-junction shown in chart 1070 of FIG. 10g (linear scale) and chart 1080 of FIG. 10h (logarithm scale), which exhibits clear rectifying behavior. Moreover, by changing the gate voltages applied to the diode, the energy band of the nanotube in the channel can be modulated and this results in the modulation of the current. The gate dependence of the I-V characteristics of the diode is plotted in chart 1090 of FIG. 10i. The I-V characteristics are shown for gate voltages ($V_G$) of −6 V 1091, −4V 1092, −2 V 1093, 0 V 1094, 2 V 1095, 4 V 1096 and 6 V 1097.

Figure 11A:
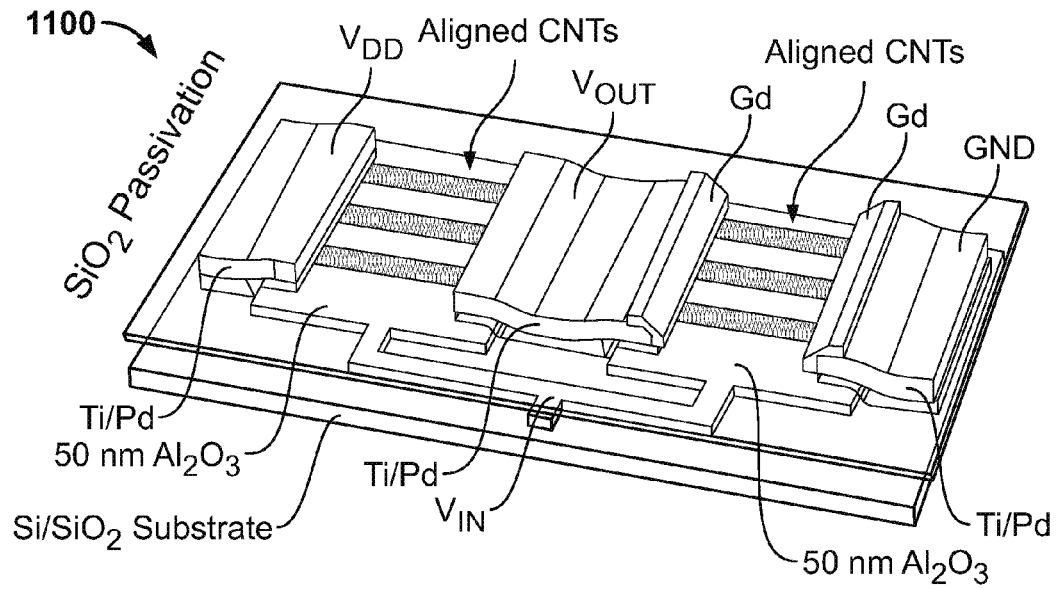
FIGS. 11a and 11b show the schematic diagram and optical microscope image of the integrated CMOS inverter.
Figure 11B:
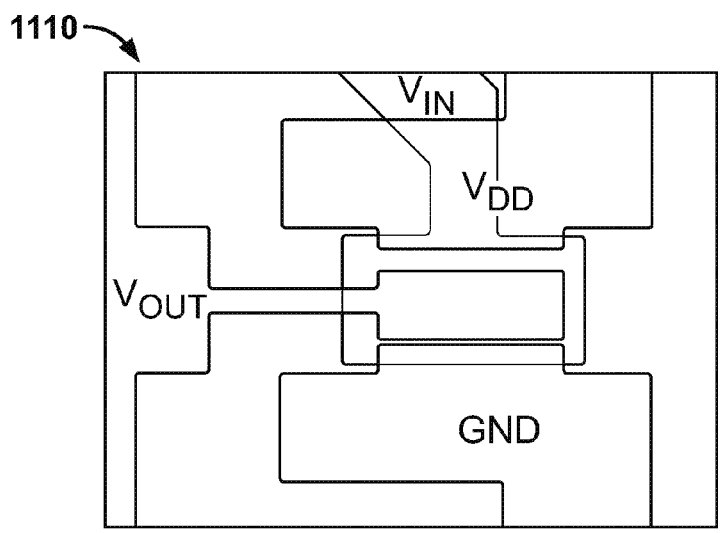
Figure 11C:
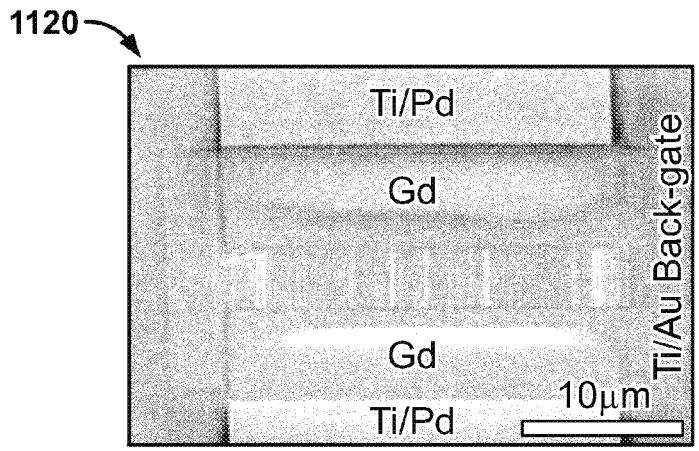
FIG. 11c shows an SEM image (with artificial color) showing an n-type branch of the CMOS inverter which clearly highlights the aligned carbon nanotubes in the channel, original Ti/Pd metal contacts, Gd source/drain extensions and Ti/Au back-gate.

Furthermore, an integrated CMOS inverter can be demonstrated with different source drain metal contacts for optimum pull-up and pull-down performance. FIGS. 11a and 11b show a schematic diagram 1100 and an optical microscope image 1110 of an integrated CMOS inverter. The CMOS inverter shown in FIGS. 11a and 11b features individual Ti/Au back-gate, Pd contacted p-type device and Gd contacted n-type device. FIG. 11c is an SEM image 1120 (with artificial color) showing the n-type branch of the CMOS inverter which clearly highlights the aligned carbon nanotubes in the channel, original Ti/Pd metal contacts, Gd source/drain extensions and Ti/Au back-gate.

Figure 11D:
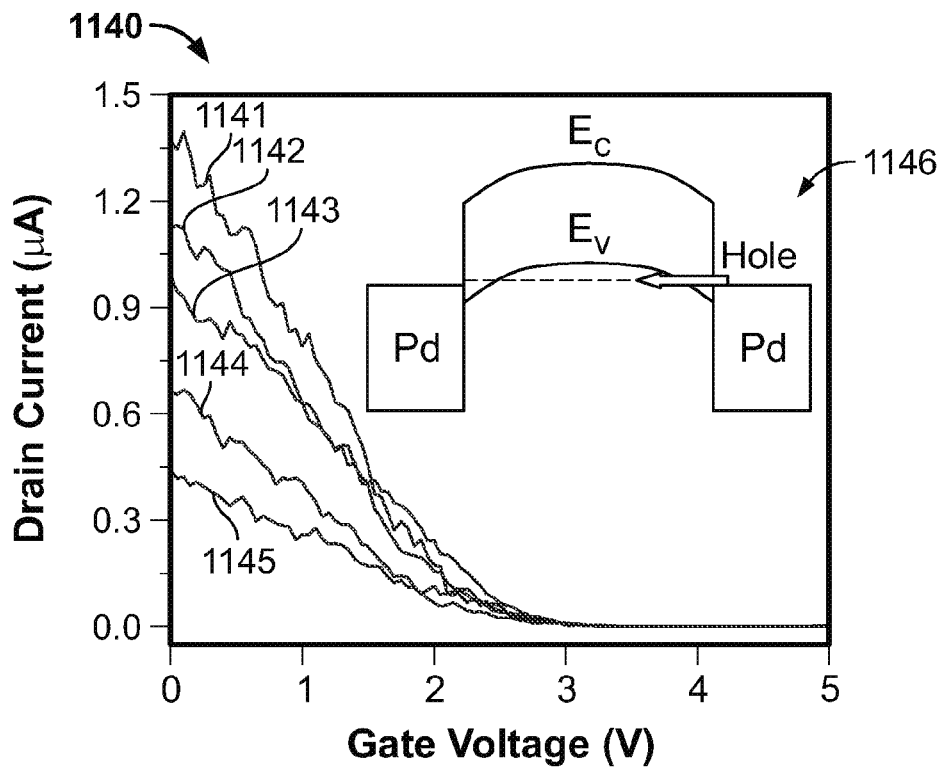
FIG. 11d shows transfer characteristics of a p-type pull-up branch of a CMOS inverter.
Figure 11E:
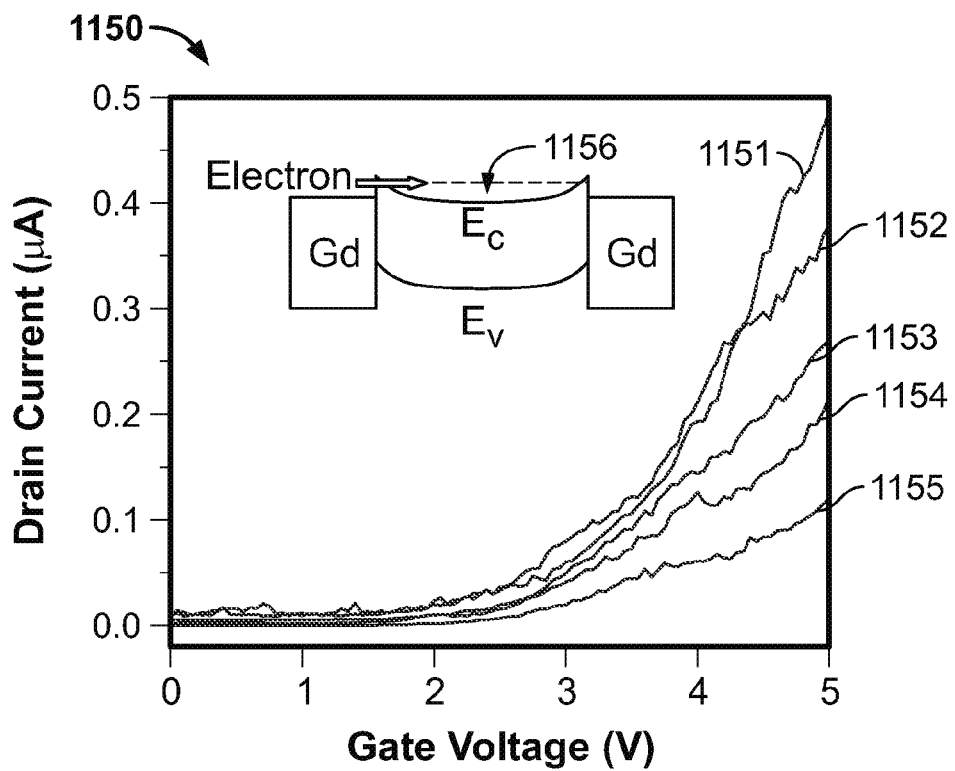
FIG. 11e shows transfer characteristics of an n-type pull-down branch of a CMOS inverter.

FIGS. 11d and 11e show the transfer characteristics of a p-type pull-up branch, and an n-type pull-down branch of the CMOS inverter respectively. The corresponding energy band diagrams 1146 and 1156 are shown as the insets. From their transfer characteristics, the output resistance of the p-type and n-type transistors can be derived at different gate voltages. For example, FIG. 11d shows the drain current-gate voltage ($I_D$-$V_G$) curves 1141, 1142, 1143, 1144 and 1145 for the p-type transistor. From the curves 1141, 1142, 1143, 1144 and 1145, the output resistance can be derived. FIG. 11e shows the drain current-gate voltage ($I_D$-$V_G$) curves 1151, 1152, 1153, 1154 and 1155 for the n-type transistor. From the curves 1151, 1152, 1153, 1154 and 1155, the output resistance can be derived.

Figure 11F:
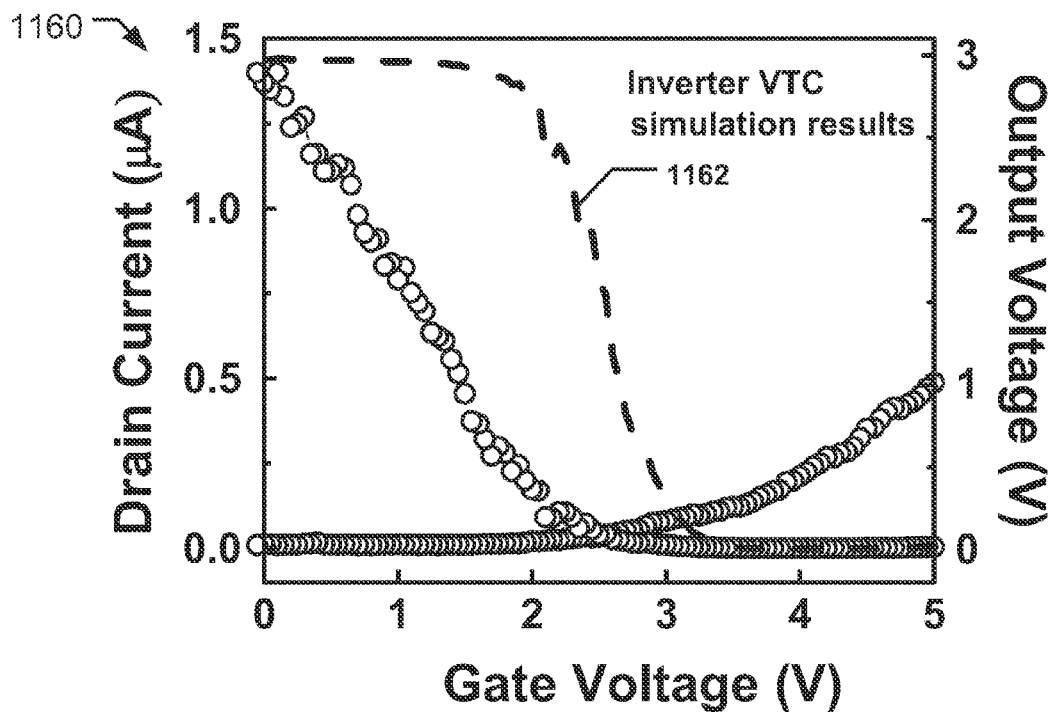
FIG. 11f shows simulated inverter voltage transfer characteristics (VTC).
Figure 11G:
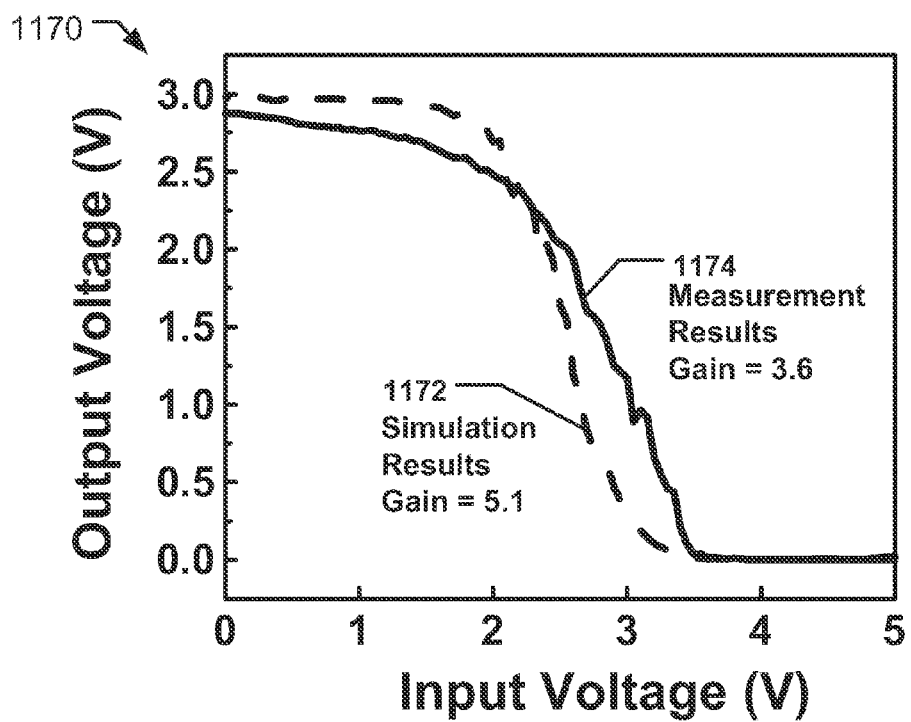
FIG. 11g shows a comparison of measurement results with simulation results.
Figure 12A:
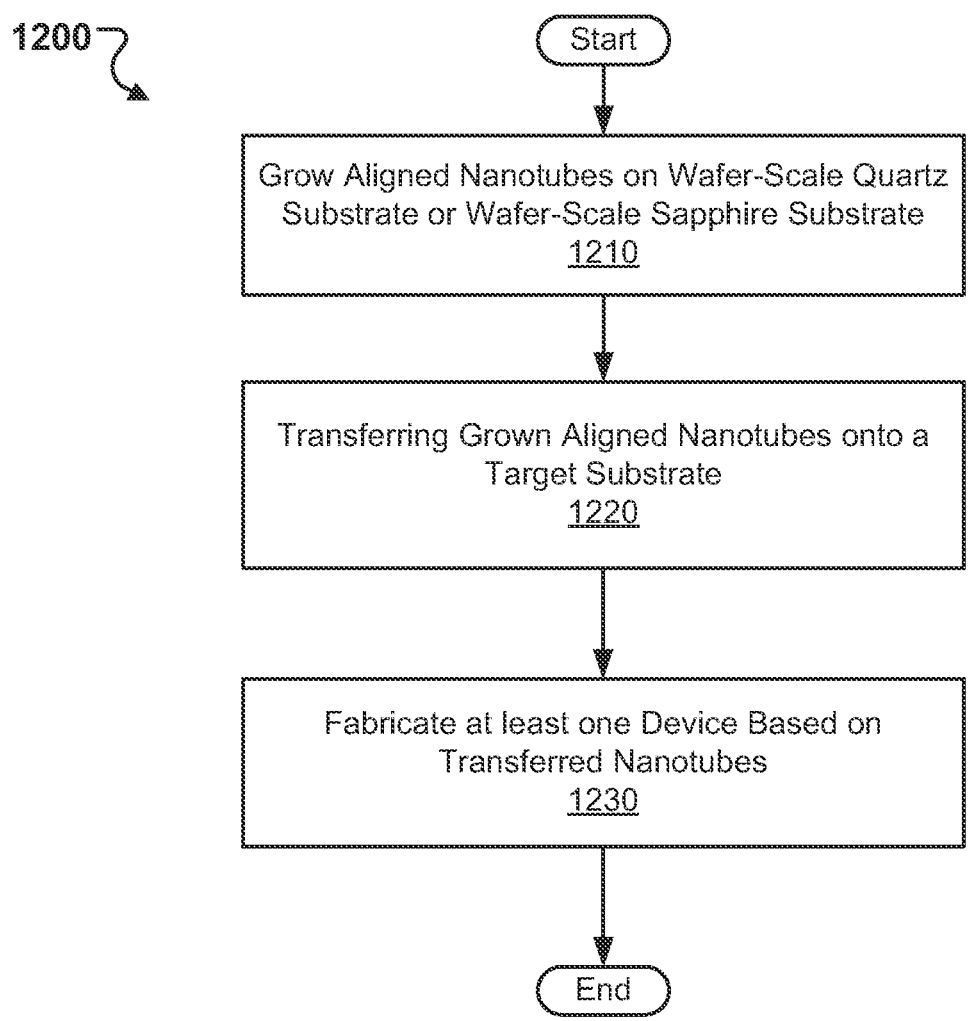
FIGS. 12a-g show implementations of a process for wafer-scale processing of aligned nanotube devices.
Figure 12B:
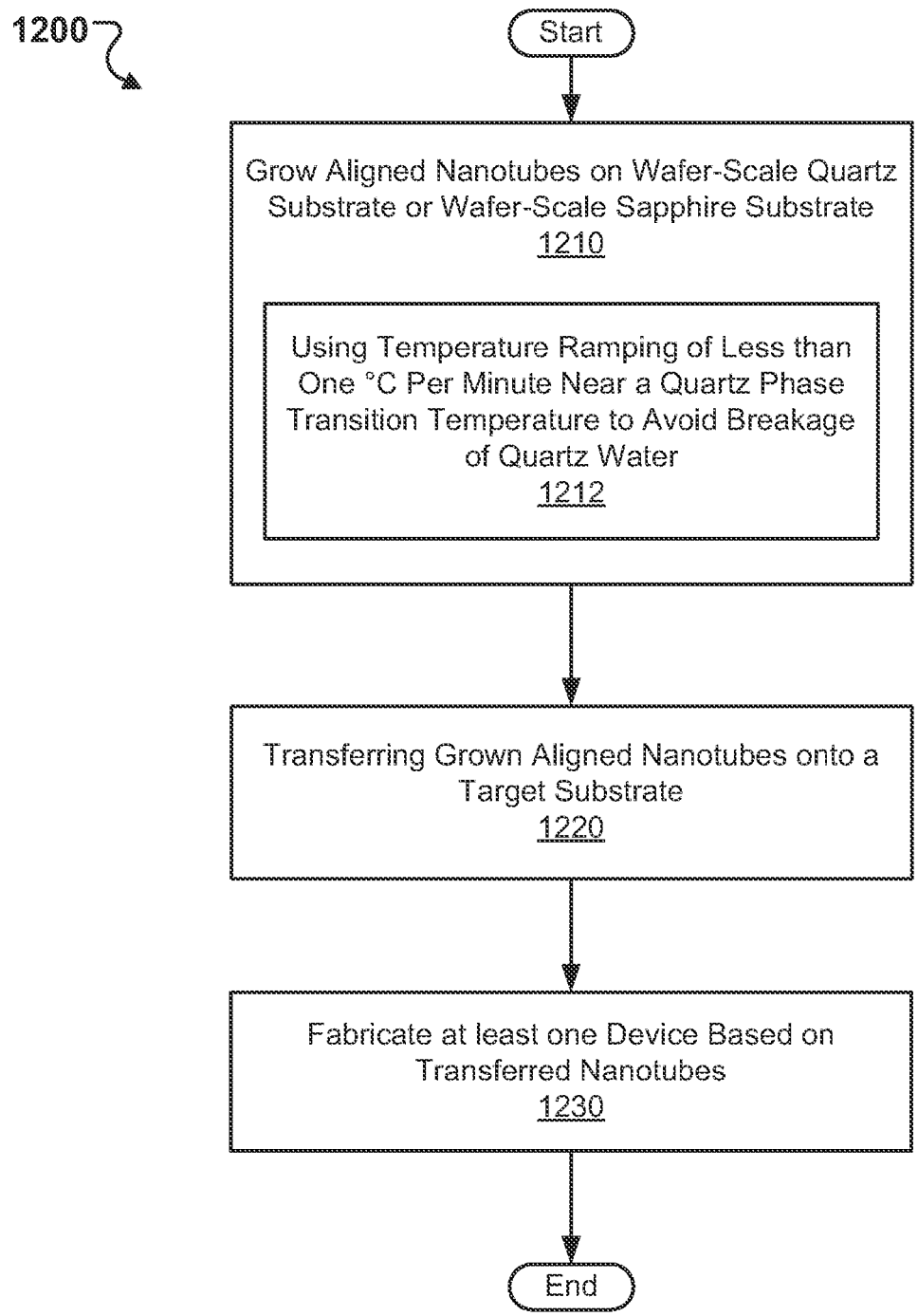
Figure 12C:
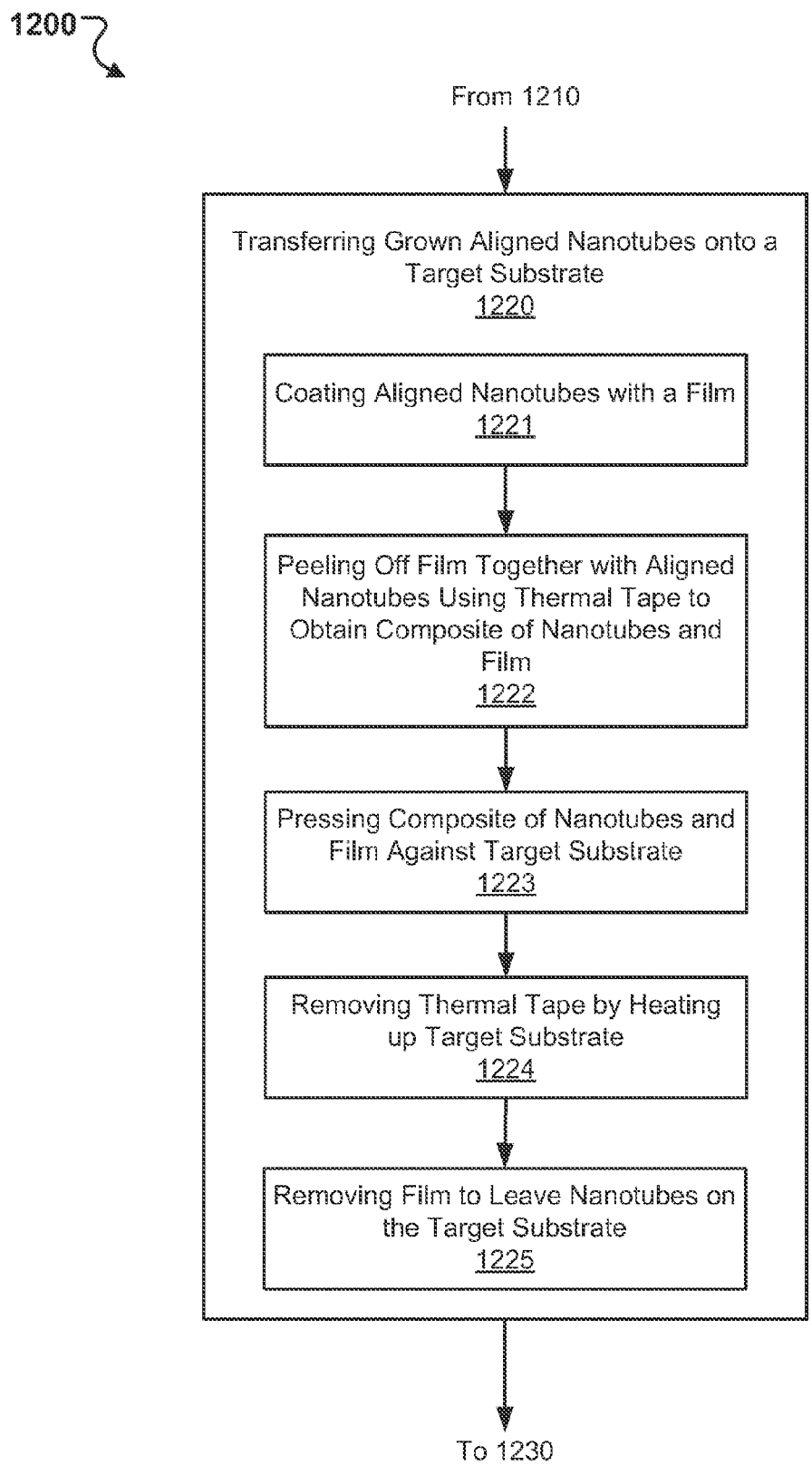
Figure 12D:
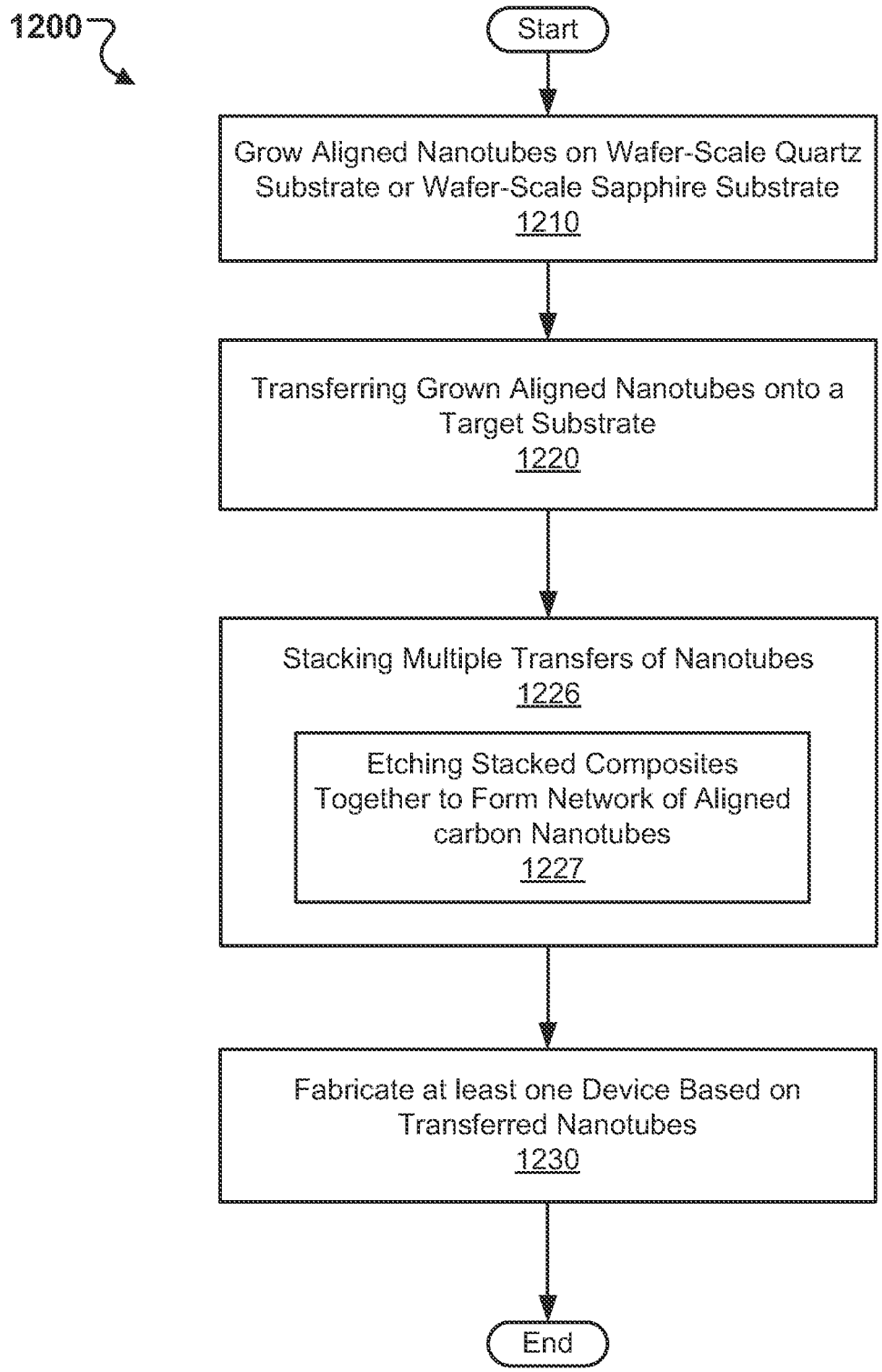
Figure 12E:
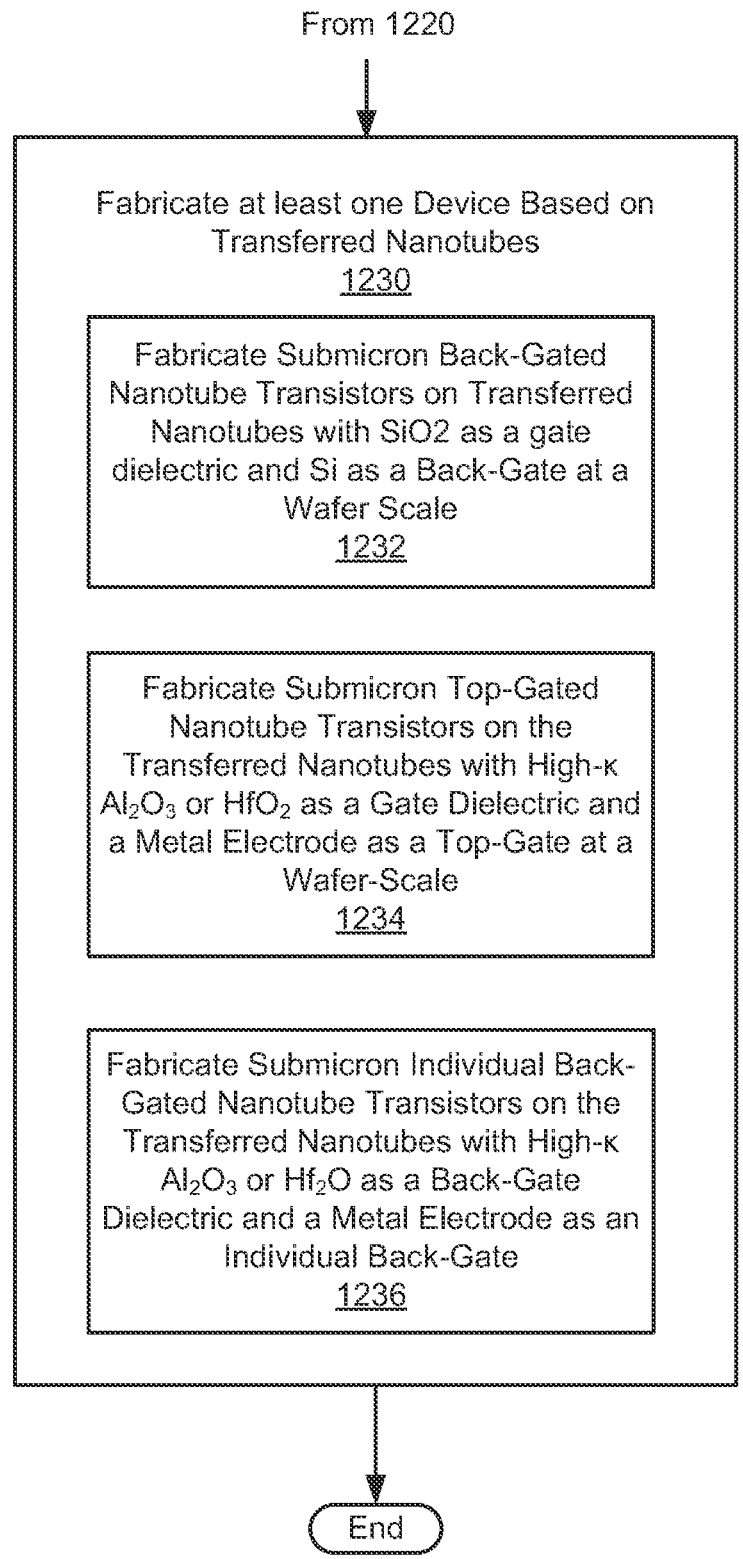
Figure 12F:
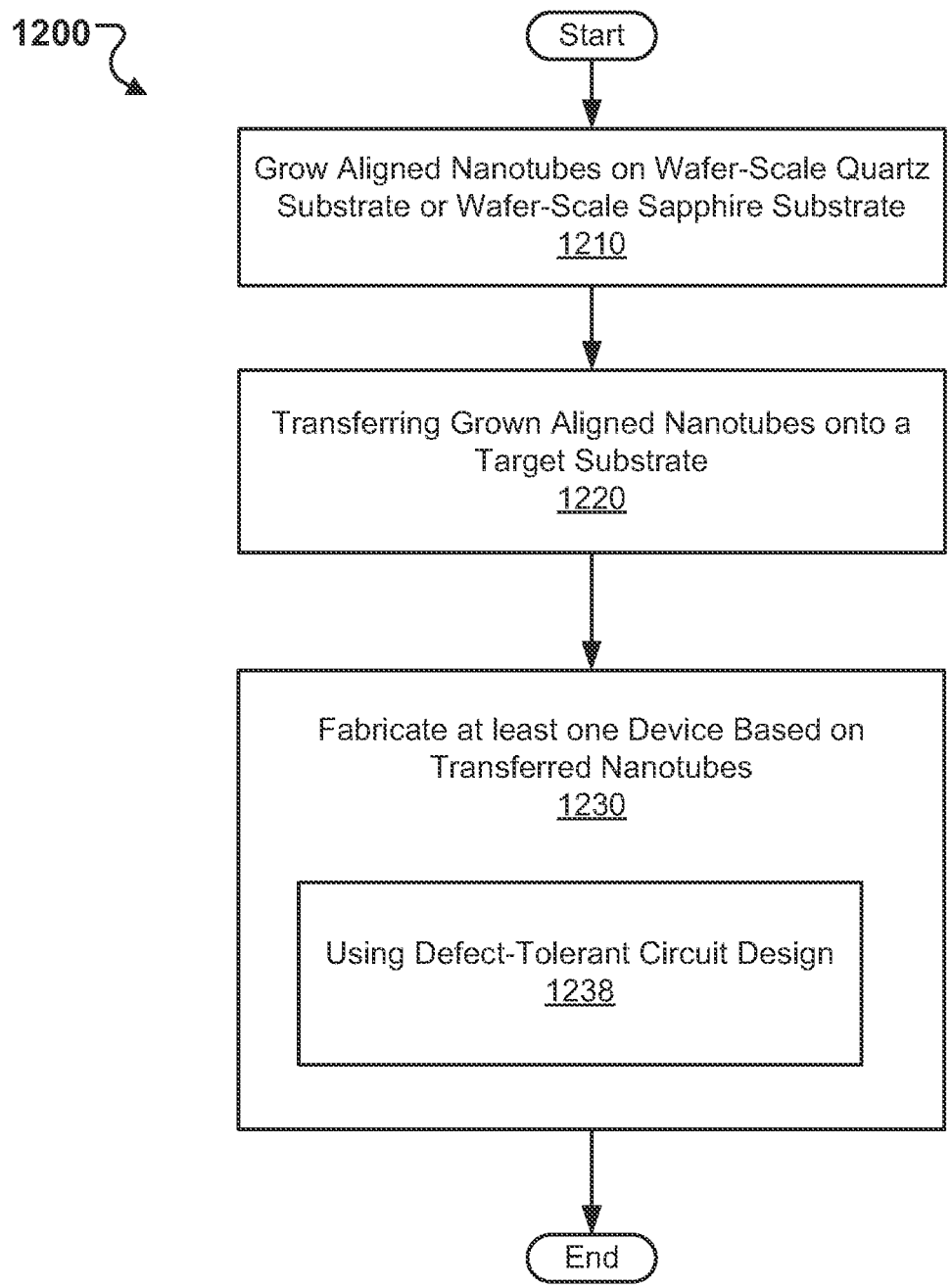
Figure 12G:
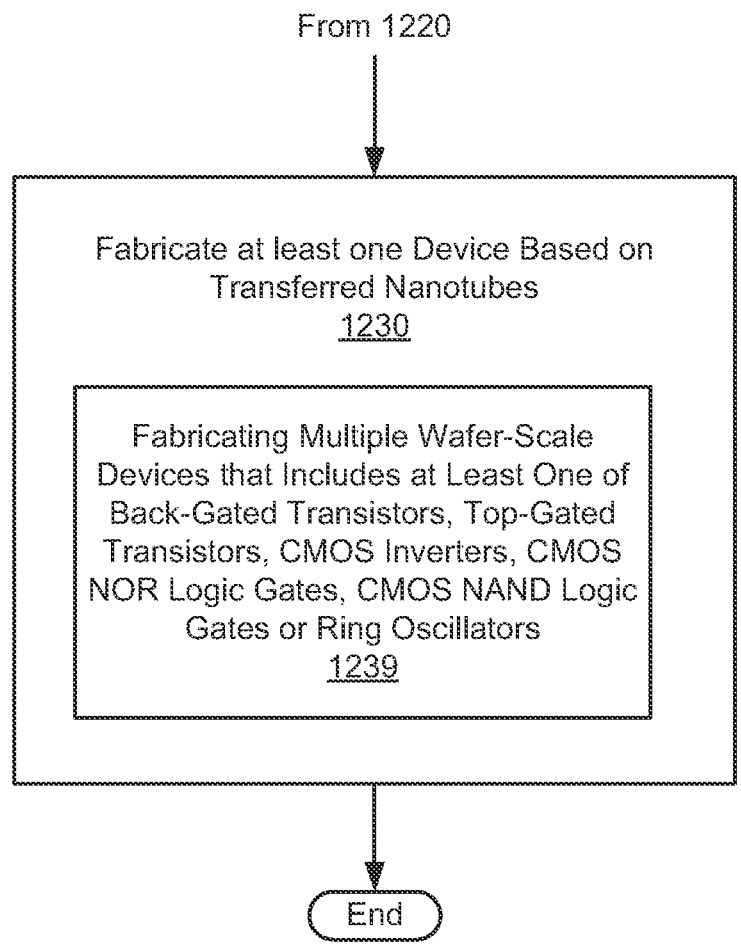

Based on the derived output resistances and by treating p-type and n-type transistors as a voltage divider, the simulated inverter voltage transfer characteristics (VTC) 1162 can be derived as shown in FIG. 11f. To measure the VTC of the inverter, 3 V can be applied as the $V_{DD}$ and the input voltage can be swept from 0 V to 5 V. The measurement results are compared with the simulation results obtained from FIG. 11f and are plotted in FIG. 11g. The measurement results 1174 match the simulation results 1172 well. As input voltage increases, the output voltage changes from $V_{DD}$ to 0, and this rail-to-rail operation is expected since it is a CMOS inverter. The switching threshold happens at around $V_{IN}$=2.65 V when both NMOS and PMOS are simultaneously on, and this results in a maximum gain of 3.6.

FIGS. 12a-g show implementations of a process 1200 for wafer-scale processing of aligned nanotube devices. The process 1200 can include growing aligned nanotubes on at least one of a wafer-scale quartz substrate or a wafer-scale sapphire substrate (1210); transferring the grown aligned nanotubes onto a target substrate (1220); and fabricating at least one device based on the transferred nanotubes (1230).

The at least one of a wafer-scale quartz substrate or a wafer-scale sapphire substrate can be sized to be at least one of two inches in diameter. Growing the aligned nanotubes on the at least one of a wafer-scale quartz substrate or a wafer-scale sapphire substrate can be carried out with a temperature ramping rate of less than one ° C. per minute but greater than zero ° C. per minute near a quartz phase transition temperature to avoid breakage of quartz wafer (1212).

Transferring the grown aligned nanotubes onto a target substrate can include coating the aligned nanotubes with a film (1221); peeling off the film together with aligned nanotubes using a thermal tape to obtain a composite of the nanotubes and the film (1222); pressing the composite of the nanotubes and the film against the target substrate (1223); removing the thermal tape by heating up the target substrate (1224); and removing the film to leave the nanotubes on the target substrate (1225).

The method can include stacking multiple transfers of nanotubes to increase tube density (1226). Stacking multiple transfers can include stacking multiple composites of the nanotubes and the film on top of each other and over the target substrate. The stacked composites can be etched together to form a network of the aligned nanotubes on the target substrate (1227). The film can include at last one of a metal film or a polymer film. The metal film can include at least one of aluminum or copper. The polymer film can include Poly (methyl methacrylate) (PMMA).

The fabricating can include fabricating submicron back-gated nanotube transistors on the transferred nanotubes with SiO2 as a gate dielectric and Si as a back-gate at a wafer-scale (1232). The fabricating can include fabricating submicron top-gated nanotube transistors on the transferred nanotubes with high-κ Al2O3 or HfO2 as a gate dielectric and a metal electrode as a top-gate at a wafer-scale (1234). Additionally, stacking multiple transfers of nanotubes can be performed to increase tube density. The fabricating can include fabricating submicron individual back-gated nanotube transistors on the transferred nanotubes with high-κ $Al_2O_3$ or $Hf_2O$ as a back-gate dielectric and a metal electrode as an individual back-gate (1236).

The method can include using a defect-tolerant circuit design for a nanotube based integrated circuit, wherein the defect-tolerant circuit design comprises etching away unwanted nanotubes and using same group of nanotubes for the at least one device (1238). The individual back-gated nanotube transistors can facilitate a doping process. The method can include using at least one metal with low work functions as source and drain contacts to align the nanotubes for at least one of n-type nanotube transistors, PN junctions, or CMOS integrated circuits. The at least one metal with low work functions comprises Scandium (Sc), Yttrium (Y), Gadolinium (Gd), Dysprosium (Dy), Ytterbium (Yb), or Terbium (Tb). The fabricating can include fabricating multiple wafer-scale devices comprising at least one of back-gated transistors, top-gated transistors, CMOS inverters, CMOS NOR logic gates, CMOS NAND logic gates, or ring oscillators (1239).

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. However, it is understood that variations and enhancements may be made.

What is claimed is:

1. A method comprising:
   growing aligned carbon nanotubes on a substrate of a first type;
   transferring the aligned carbon nanotubes onto a substrate of a second type by (i) repeatedly applying film and tape to form a stack of layers on the substrate of the second type, wherein each of the layers in the stack comprises at least some of the aligned carbon nanotubes in the film of that layer, and (ii) removing the film from the stack to leave the transferred carbon nanotubes on the substrate of the second type; and
   fabricating at least one device using the transferred carbon nanotubes on the substrate of the second type.

2. The method of claim 1, wherein the film comprises polymethylmethacrylate (PMMA).

3. The method of claim 1, wherein the film comprises gold film, and the removing comprises using gold etchant.

4. The method of claim 3, wherein the tape comprises thermal tape, and the applying comprises, for each of the layers:
   depositing the gold film on carbon nanotubes on the substrate of the first type to form the layer;
   using the thermal tape to remove the layer from the substrate of the first type at a first temperature;
   placing the layer on the substrate of the second type; and
   removing the thermal tape from the layer at a second temperature.

5. The method of claim 1, wherein the substrate of the first type comprises a quartz substrate.

6. The method of claim 5, wherein the growing comprises using a temperature ramping rate of less than one ° C. per minute but greater than zero ° C. per minute.

7. The method of claim 1, wherein the substrate of the first type comprises a sapphire substrate.

8. The method of claim 1, wherein the substrate of the second type comprises a Si/SiO$_2$ wafer.

9. A method comprising:
   growing aligned carbon nanotubes on a substrate of a first type;
   transferring the aligned carbon nanotubes onto a substrate of a second type; and
   fabricating at least one device using the transferred carbon nanotubes on the substrate of the second type;

wherein the fabricating comprises forming a p-type transistor using a large work function metal for a p-type contact of the p-type transistor, and forming an n-type transistor using a small work function metal for an n-type contact of the n-type transistor.

10. The method of claim 9, wherein the large work function metal comprises Palladium (Pd).

11. The method of claim 10, wherein the small work function metal comprises Gadolinium (Gd).

12. The method of claim 10, wherein the small work function metal comprises Scandium (Sc).

13. The method of claim 10, wherein the small work function metal comprises Yttrium (Y).

14. The method of claim 10, wherein the small work function metal comprises Dysprosium (Dy).

15. The method of claim 10, wherein the small work function metal comprises Ytterbium (Yb).

16. The method of claim 10, wherein the small work function metal comprises Terbium (Tb).

17. A method comprising:
growing carbon nanotubes on a substrate of a first type;
transferring the carbon nanotubes onto a substrate of a second type; and
fabricating at least one device using the transferred carbon nanotubes on the substrate of the second type;
wherein the fabricating comprises forming a defect-tolerant circuit comprising two transistors connected in parallel that utilize a same bunch of carbon nanotubes, the two transistors having control gates A and B, and a source of electricity connected with the same bunch of carbon nanotubes between a bifurcated output.

18. The method of claim 17, wherein the defect-tolerant circuit comprises a NAND circuit that performs correctly with nonuniform nanotube density and misaligned nanotubes.

19. The method of claim 17, wherein the gates A and B comprise top-gates.

20. The method of claim 17, wherein the gates A and B comprise back-gates.

21. The method of claim 20, wherein the circuit comprises a NOR device.

22. The method of claim 20, wherein the circuit comprises a NAND device.

* * * * *